US010525696B2

(12) United States Patent
Nakamura et al.

(10) Patent No.: US 10,525,696 B2
(45) Date of Patent: Jan. 7, 2020

(54) LITHOGRAPHIC PRINTING PLATE PRECURSOR, LITHOGRAPHIC PRINTING PLATE MANUFACTURING METHOD, PRINTING METHOD AND ALUMINUM SUPPORT MANUFACTURING METHOD

(71) Applicant: FUJIFILM CORPORATION, Tokyo (JP)

(72) Inventors: Ryo Nakamura, Haibara-gun (JP); Atsushi Matsuura, Haibara-gun (JP); Tsuyoshi Hirokawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/245,505

(22) Filed: Jan. 11, 2019

(65) Prior Publication Data

US 2019/0143666 A1 May 16, 2019

Related U.S. Application Data

(63) Continuation of application No. PCT/JP2018/030193, filed on Aug. 13, 2018.

(30) Foreign Application Priority Data

Oct. 31, 2017 (JP) ................................ 2017-210265
Mar. 19, 2018 (JP) ................................ 2018-051237

(51) Int. Cl.
*G03F 7/32* (2006.01)
*B41C 1/10* (2006.01)
(Continued)

(52) U.S. Cl.
CPC ........... *B41C 1/1016* (2013.01); *B41N 1/083* (2013.01); *B41N 3/034* (2013.01);
(Continued)

(58) Field of Classification Search
CPC ........................................................ G03F 7/32
See application file for complete search history.

(56) References Cited

U.S. PATENT DOCUMENTS

2005/0208422 A1 9/2005 Matsuura et al.
2008/0160445 A1 7/2008 Nonaka
(Continued)

FOREIGN PATENT DOCUMENTS

CN 102686409 A 9/2012
JP 2005-066829 A 3/2005
(Continued)

OTHER PUBLICATIONS

Written Opinion for PCT/JP2018/030193 dated Sep. 11, 2018 [PCT/ISA/237].
(Continued)

*Primary Examiner* — Chanceity N Robinson
(74) *Attorney, Agent, or Firm* — Sughrue Mion, PLLC

(57) ABSTRACT

A lithographic printing plate precursor, a lithographic printing plate manufacturing method, a printing method and an aluminum support manufacturing method enable the resulting lithographic printing plate to have a long tiny dot press life. The lithographic printing plate precursor includes an aluminum support and an image recording layer. When measured over a 400 μm×400 μm region of a surface of the aluminum support on the image recording layer side using a three-dimensional non-contact roughness tester, pits with a depth from centerline of at least 0.70 μm are present at a density of at least 3,000 pits/$mm^2$. A surface area ratio ΔS is not less than 35%, where ΔS is determined using an actual area $S_x$ obtained, through three-point approximation, from three-dimensional data acquired by measurement at 512×512 points in 25 μm square of the surface of the aluminum support on the image recording layer side.

20 Claims, 2 Drawing Sheets

(51) Int. Cl.
*B41N 1/08* (2006.01)
*B41N 3/03* (2006.01)
*B41F 7/00* (2006.01)

(52) U.S. Cl.
CPC ...... *B41C 2210/06* (2013.01); *B41C 2210/22* (2013.01); *B41C 2210/24* (2013.01); *B41C 2210/262* (2013.01); *B41F 7/00* (2013.01)

(56) References Cited

U.S. PATENT DOCUMENTS

| | | | | |
|---|---|---|---|---|
| 2008/0254384 | A1* | 10/2008 | Iwai | B41C 1/1008 430/281.1 |
| 2009/0226666 | A1* | 9/2009 | Suzuki | B22D 11/043 428/141 |
| 2011/0265673 | A1 | 11/2011 | Tagawa et al. | |
| 2012/0298001 | A1 | 11/2012 | Kurokawa et al. | |

FOREIGN PATENT DOCUMENTS

| | | | |
|---|---|---|---|
| JP | 2005-262530 | A | 9/2005 |
| JP | 2007-125872 | A | 5/2007 |
| JP | 2008-272743 | A | 11/2008 |
| JP | 2012192724 | A | 10/2012 |
| JP | 2015-189021 | A | 11/2015 |

OTHER PUBLICATIONS

International Search Report for PCT/JP2018/030193 dated Sep. 11, 2018 [PCT/ISA/210].

Communication dated Sep. 25, 2019 from the State intellectual Property Office of the P.R.C in application No. 201880002841.2.

* cited by examiner

LITHOGRAPHIC PRINTING PLATE PRECURSOR, LITHOGRAPHIC PRINTING PLATE MANUFACTURING METHOD, PRINTING METHOD AND ALUMINUM SUPPORT MANUFACTURING METHOD

CROSS-REFERENCE TO RELATED APPLICATIONS

This application is a Continuation of PCT International Application No. PCT/JP2018/030193 filed on Aug. 13, 2018, which claims priority under 35 U.S.C. § 119(a) to Japanese Patent Application No. 2017-210265 filed on Oct. 31, 2017 and Japanese Patent Application No. 2018-051237 filed on Mar. 19, 2018. Each of the above applications is hereby expressly incorporated by reference, in its entirety, into the present application.

TECHNICAL FIELD

The present invention relates to a lithographic printing plate precursor, a lithographic printing plate manufacturing method, a printing method, and an aluminum support manufacturing method.

BACKGROUND ART

For aluminum supports used in lithographic printing plates, it is known that a surface of an aluminum support is grained (i.e., subjected to surface roughening treatment) to provide asperities for the purpose of improving scumming resistance and a press life of the resulting lithographic printing plate.

For instance, Patent Literature 1 describes "a support for a lithographic printing plate which, when measured over a 400 μm×400 μm surface region thereon using a three-dimensional non-contact roughness tester, has at most 5.0 convex portions of a height from centerline of at least 0.70 μm and an equivalent circle diameter of at least 20 μm, and has at least 800 concave portions of a depth from centerline of at least 0.50 μm and an equivalent circle diameter of at least 2.0 μm" (claim 1), as well as a lithographic printing plate precursor comprising the support for a lithographic printing plate as above and an image recording layer thereon (claim 3).

CITATION LIST

Patent Literature

Patent Literature 1: JP 2005-262530 A

SUMMARY OF INVENTION

Technical Problems

The present inventors studied on the lithographic printing plate precursor described in Patent Literature 1 and found that, in printing, defects such as chipping and sharpening occur in a halftone dot portion with a halftone dot area ratio of 3% (hereinafter referred to as "tiny dot") and thus, a tiny dot press life is short.

The halftone dot area ratio herein refers to the proportion of area occupied by halftone dots per unit area, and is 0% in a white portion and 100% in a solid (black) portion.

Accordingly, an object of the present invention is to provide a lithographic printing plate precursor, a lithographic printing plate manufacturing method, a printing method and an aluminum support manufacturing method that enable the resulting lithographic printing plate to have a long tiny dot press life.

Solution to Problems

The present inventors have made an intensive study to achieve the above object and as a result found that in a lithographic printing plate precursor having an aluminum support and an image recording layer disposed above the aluminum support, when the surface of the aluminum support on the image recording layer side has pits with a predetermined depth at a predetermined density, the resulting lithographic printing plate can have a long tiny dot press life, and the invention has been thus completed.

In other words, the present inventors have found that the foregoing object can be achieved with the configuration below.

[1] A lithographic printing plate precursor having an aluminum support and an image recording layer disposed above the aluminum support, wherein the aluminum support includes an aluminum plate and an anodized film of aluminum formed on the aluminum plate, wherein the image recording layer is positioned on the anodized film side of the aluminum support, wherein when measured over a 400 μm×400 μm region of a surface of the aluminum support on the image recording layer side using a three-dimensional non-contact roughness tester, pits with a depth from centerline of at least 0.70 μm are present at a density of at least 3,000 pits/mm², and wherein a surface area ratio ΔS is not less than 35%, the surface area ratio ΔS being determined by Formula (1):

$$\Delta S=(S_x-S_0)/S_0\times 100(\%) \quad (1)$$

using an actual area $S_x$ obtained, through three-point approximation, from three-dimensional data acquired by measurement at 512×512 points in 25 μm square of the surface of the aluminum support on the image recording layer side by means of an atomic force microscope and a geometrically measured area $S_o$.

[2] The lithographic printing plate precursor according to [1], wherein the surface of the aluminum support on the image recording layer side has pits having an average aperture size of 0.01 to 0.5 μm.

[3] The lithographic printing plate precursor according to [1] or [2], wherein the surface of the aluminum support on the image recording layer side has a lightness L* of 68 to 90 in a L*a*b color system.

[4] The lithographic printing plate precursor according to any one of [1] to [3], wherein the anodized film has micropores extending from a surface of the anodized film opposite from the aluminum plate in a depth direction of the anodized film, and wherein an average diameter of the micropores at the surface of the anodized film is from 10 to 150 nm.

[5] The lithographic printing plate precursor according to [4], wherein the average diameter of the micropores at the surface of the anodized film is from 10 to 100 nm.

[6] The lithographic printing plate precursor according to [5], wherein each of the micropores has a large-diameter portion which extends from the surface of the anodized film to a depth of 10 to 1,000 nm and a small-diameter portion which communicates with a bottom of the large-diameter portion and extends to a depth of 20 to 2,000 nm from a communication position between the small-diameter portion and the large-diameter portion, wherein an average diameter of the large-diameter portion at the surface of the anodized film is 15 to 60 nm, and wherein an average diameter of the small-diameter portion at the communication position is not more than 13 nm.

[7] The lithographic printing plate precursor according to any one of [1] to [6], further including an undercoat layer between the aluminum support and the image recording layer, wherein the undercoat layer contains polyvinylphosphonic acid.

[8] The lithographic printing plate precursor according to any one of [1] to [6], further including an undercoat layer between the aluminum support and the image recording layer, wherein the undercoat layer contains a compound having a betain structure.

[9] A lithographic printing plate manufacturing method, comprising:

an exposure step of imagewise exposing the lithographic printing plate precursor according to any one of [1] to [8] to form exposed portions and unexposed portions; and a removal step of removing the unexposed portions of the lithographic printing plate precursor having been imagewise exposed.

[10] A printing method, comprising:

an exposure step of imagewise exposing the lithographic printing plate precursor according to any one of [1] to [8] to form exposed portions and unexposed portions; and a printing step of performing printing by supplying at least one of printing ink and fountain solution to remove the unexposed portions of the lithographic printing plate precursor having been imagewise exposed, on a printing press.

[11] A method of manufacturing an aluminum support used in the lithographic printing plate precursor according to any one of [1] to [8], the method comprising:

a hydrochloric acid electrolytic treatment step of subjecting an aluminum plate to alternating current electrolysis in a hydrochloric acid treatment solution having a sulfuric acid concentration of 0.1 to 2.0 g/L to thereby manufacture a surface-roughened aluminum plate.

[12] The method of manufacturing an aluminum support according to [11], the method comprising:

an anodizing treatment step of anodizing the surface-roughened aluminum plate to form an anodized film of aluminum on the aluminum plate; and a pore-widening treatment step of enlarging a diameter of micropores present in the anodized film by subjecting the aluminum plate having the anodized film formed thereon to etching treatment, the anodizing treatment step and the pore-widening treatment step being carried out in this order after the hydrochloric acid electrolytic treatment step.

[13] The method of manufacturing an aluminum support according to [12], wherein the anodizing treatment step is a step of carrying out anodizing treatment using phosphoric acid.

[14] A lithographic printing plate precursor having an aluminum support and an image recording layer disposed above the aluminum support, wherein the aluminum support includes an aluminum plate and an anodized film of aluminum formed on the aluminum plate, wherein the image recording layer is positioned on the anodized film side of the aluminum support, and wherein when measured over a 400 μm×400 μm region of a surface of the aluminum support on the image recording layer side using a three-dimensional non-contact roughness tester, pits with a depth from centerline of at least 0.70 μm are present at a density of at least 3,000 pits/mm$^2$.

[15] The lithographic printing plate precursor according to [14], wherein the surface of the aluminum support on the image recording layer side has a lightness L* of 68 to 90 in a L*a*b* color system.

[16] The lithographic printing plate precursor according to [14] or [15], wherein the anodized film has micropores extending from a surface of the anodized film opposite from the aluminum plate in a depth direction of the anodized film, and wherein an average diameter of the micropores at the surface of the anodized film is from 10 to 150 nm.

[17] The lithographic printing plate precursor according to any one of [14] to [16], wherein each of the micropores has a large-diameter portion which extends from the surface of the anodized film to a depth of 10 to 1,000 nm and a small-diameter portion which communicates with a bottom of the large-diameter portion and extends to a depth of 20 to 2,000 nm from a communication position between the small-diameter portion and the large-diameter portion, wherein an average diameter of the large-diameter portion at the surface of the anodized film is 15 to 60 nm, and wherein an average diameter of the small-diameter portion at the communication position is not more than 13 nm.

[18] The lithographic printing plate precursor according to any one of [14] to [17], wherein the surface of the aluminum support on the image recording layer side has a lightness L* of 75 to 90 in a L*a*b* color system.

[19] The lithographic printing plate precursor according to any one of [14] to [18], wherein the image recording layer contains a polymeric compound in a form of fine particles, and the polymeric compound in the form of fine particles contains a copolymer including styrene and acrylonitrile.

[20] The lithographic printing plate precursor according to any one of [14] to [19], wherein the image recording layer contains a borate compound.

[21] The lithographic printing plate precursor according to any one of [14] to [20], wherein the image recording layer contains an acid color former.

Advantageous Effects of Invention

The present invention can provide a lithographic printing plate precursor, a lithographic printing plate manufacturing method, a printing method and an aluminum support manufacturing method that enable the resulting lithographic printing plate to have a long tiny dot press life.

DESCRIPTION OF EMBODIMENTS

Figure 1:
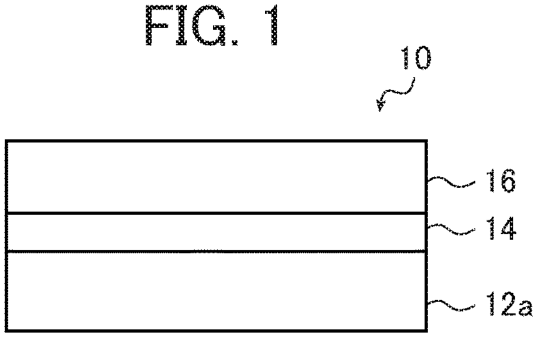
FIG. 1 is a schematic cross-sectional view of an example of a lithographic printing plate precursor of the invention.

The invention is described in detail below.

While the constituent features are sometimes described based on typical embodiments of the invention, the invention is not limited to those embodiments.

In the present description, a numerical range expressed by using "to" is a range including values stated before and after "to" as the upper and lower limits of the range.

In the present description, when there is no mention as to whether a group in a compound expressed by a formula is substituted or unsubstituted, in cases where the group can further have a substituent, the group comprises not only an unsubstituted group but also a group with a substituent unless otherwise specified. For instance, when a formula is accompanied by the description "R is an alkyl group, an aryl group or a heterocyclic group," this means "R is an unsubstituted alkyl group, a substituted alkyl group, an unsubstituted aryl group, a substituted aryl group, an unsubstituted heterocyclic group or a substituted heterocyclic group."

[Lithographic Printing Plate Precursor]

A lithographic printing plate precursor of the invention is one having an aluminum support and an image recording layer disposed above the aluminum support.

The aluminum support included in the lithographic printing plate precursor of the invention has an aluminum plate and an anodized aluminum film disposed on the aluminum plate.

The image recording layer included in the lithographic printing plate precursor of the invention is positioned on the anodized film side of the aluminum support.

The lithographic printing plate precursor of the invention, when measured over a 400 μm×400 μm surface region of the aluminum support on the image recording layer side using a three-dimensional non-contact roughness tester, has pits with a depth from centerline of at least 0.70 μm (hereinafter also referred to as "specific pits") at a density of at least 3,000 pits/mm$^2$.

It is preferable for the lithographic printing plate precursor of the invention that a surface area ratio ΔS be not less than 35%, the surface area ratio ΔS being determined by Formula (1) below using an actual area $S_x$ obtained, through three-point approximation, from three-dimensional data acquired by measurement at 512×512 points in 25 μm square of the surface of the aluminum support on the image recording layer side by means of an atomic force microscope and a geometrically measured area $S_o$.

$$\Delta S=(S_x-S_0)/S_0\times 100(\%) \quad (1)$$

<Density of Specific Pits>

In the present invention, the density of pits with a depth from centerline of at least 0.70 μm is determined as follows.

First, with a three-dimensional non-contact roughness tester (e.g., VertScan, manufactured by Ryoka Systems Inc.), a 400 μm×400 μm surface region of the aluminum support on the image recording layer side is scanned in a non-contact manner at a resolution of 0.01 μm to thereby obtain three-dimensional data.

Next, the obtained three-dimensional data is subjected to image analysis using software (e.g., SX Viewer, manufactured by Ryoka Systems Inc.) to determine the number of pits with a depth from centerline of at least 0.70 μm.

Measurement is carried out at five places for each sample, and the average of the measurements is calculated and converted into the number of pits per unit area (μm$^2$). The thus obtained value is determined as the density of pits.

<Surface Area Ratio ΔS>

In the present invention, the surface area ratio ΔS is a value determined by Formula (1) below using an actual area $S_x$ obtained, through three-point approximation, from three-dimensional data acquired by measurement at 512×512 points in 25 μm square of the surface of the aluminum support on the image recording layer side by means of an atomic force microscope (AFM) and a geometrically measured area $S_o$.

$$\Delta S=(S_x-S_0)/S_0\times 100(\%) \quad (1)$$

Specifically, a 1 cm square sample is cut out from the aluminum support and placed on a horizontal sample holder on a piezoelectric scanner. A cantilever is then moved to approach the surface of the sample. When the cantilever reaches the zone where interatomic forces are detectable, the surface of the sample is scanned in the XY direction, and the surface topography of the sample is read based on the piezoelectric displacement in the Z direction. The piezoelectric scanner used is capable of scanning 150 μm in the XY direction and 10 μm in the Z direction. The cantilever having a resonance frequency of 130 to 200 kHz and a spring constant of 7 to 20 N/m (OMCL-AC200TS, manufactured by Olympus Corporation) is used, and the measurement is carried out in DFM (Dynamic Force Mode). The three-dimensional data obtained is subjected to least-squares approximation to compensate for slight tilt of the sample and determine a reference plane.

In the measurement, 512×512 points are measured in 25 μm square of the surface. The resolution is 0.05 μm in the X direction, 1.9 μm in the Y direction, and 1 nm in the Z direction. The scan rate is 18 μm/s.

As described above, in the lithographic printing plate precursor of the invention, the surface of the aluminum support on the image recording layer side has the specific pits at a density of at least 3,000 pits/mm$^2$, and the resulting lithographic printing plate can have a long tiny dot press life. In particular, it is preferable for the surface area ratio ΔS to be not less than 35%.

The detailed reason why the tiny dot press life becomes longer is not clear but is presumed as follows.

When the specific pits are present at a density of at least 3,000 pits/mm$^2$, the image recording layer filling the pits is hardly worn away, and such many pits also leads to improved adhesion owing to the anchor effect; this is probably the reason why sharpening hardly occurs in a tiny dot image portion. This presumption is based on the comparison between Example 1 and Comparative Examples 1 and 2.

In addition, when the surface area ratio ΔS is not less than 35%, the contact area between the aluminum support and the image recording layer is increased, thus improving the interface adhesion force; this is probably another factor of less sharpening in a tiny dot image portion.

In the present invention, the density of the specific pits is preferably 3,000 to 6,000 pits/$mm^2$, more preferably 3,500 to 6,000 pits/$mm^2$, and even more preferably 4,000 to 6,000 pits/$mm^2$.

In the present invention, the surface area ratio ΔS is preferably 35% to 70%, more preferably 35% to 60%, and even more preferably 40% to 55%.

In the present invention, in order to improve the adhesion at the interface, the aluminum support including the aluminum plate and the anodized film preferably has the surface on the image recording layer side (that is, the surface of the anodized film) provided with pits having an average aperture size of 0.01 to 0.5 μm (hereinafter also referred to as "small-wave pits").

The average aperture size of the small-wave pits is determined as follows: The surface of the anodized film is observed with a field emission scanning electron microscope (FE-SEM) at a magnification of 50,000× to obtain three images (N=3), in the resulting three images, the diameters of 30 pits of 0.01 μm or more but 0.5 μm or less within an area of 4 $μm^2$ are measured (N=30), and the average of the diameters of 90 pits in total is calculated.

The equivalent circle diameter is used if the shape of the small-wave pit is not circular. The "equivalent circle diameter" refers to the diameter of a circle assuming that the shape of the aperture is the circle having the same projected area as that of the aperture.

In the present invention, the surface of the aluminum support on the image recording layer side, i.e., the surface of the anodized film has a lightness L* of preferably 68 to 90 and more preferably 75 to 90 in the L*a*b* color system for the purpose of improving visibility.

The a* value is preferably −4 to 4 and the b* value is preferably −4 to 4 in the L*a*b* color system.

For the L*, a* and b* values in the L*a*b* color system, each value is measured five times with a colorimeter (e.g., CR-221, manufactured by Konica Minolta, Inc.), and the average of the measurements is used.

FIG. 1 is a schematic cross-sectional view of an example of the lithographic printing plate precursor of the invention.

A lithographic printing plate precursor 10 shown in FIG. 1 includes an aluminum support 12*a* and an image recording layer 16 disposed above the aluminum support 12*a*, and as shown in FIG. 1, preferably further includes an undercoat layer 14 between the aluminum support 12*a* and the image recording layer 16.

Figure 2:
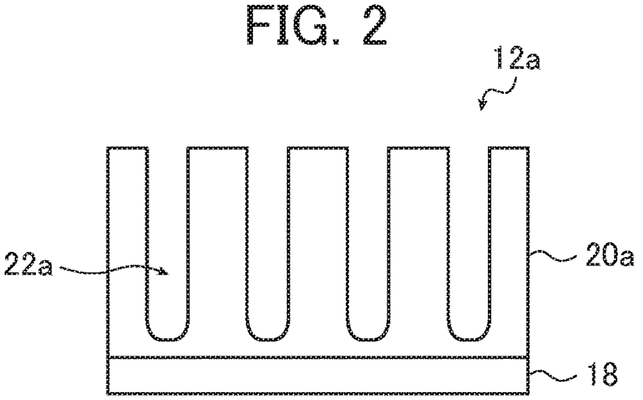
FIG. 2 is a schematic cross-sectional view of an example of an aluminum support.

FIG. 2 is a schematic cross-sectional view of an example of the aluminum support 12*a*. The aluminum support 12*a* has a laminated structure in which an aluminum plate 18 and an anodized aluminum film 20*a* (hereinafter also simply called "anodized film 20*a*") are stacked in this order. The anodized film 20*a* in the aluminum support 12*a* is positioned on the image recording layer 16 side. That is, the lithographic printing plate precursor 10 has the aluminum plate 18, the anodized film 20*a*, the undercoat layer 14 and the image recording layer 16 in this order.

Preferably, the anodized film 20*a* has micropores 22*a* extending from the surface of the film toward the aluminum plate 18 side as shown in FIG. 2. The term "micropore" used herein is commonly used to denote a pore in an anodized film and does not define the size of the pore.

As described later in detail, the undercoat layer 14 is not essential and is provided if necessary.

The respective constituents of the lithographic printing plate precursor 10 are described below in detail.

[Aluminum Plate]

The aluminum plate 18 (aluminum support) is made of a dimensionally stable metal composed primarily of aluminum; that is, aluminum or aluminum alloy. Exemplary materials of the aluminum plate 18 include a pure aluminum plate, alloy plates composed primarily of aluminum and containing small amounts of other elements, and plastic films or paper on which aluminum (alloy) is laminated or vapor-deposited.

Other elements which may be present in the aluminum alloy include silicon element, iron element, manganese element, copper element, magnesium element, chromium element, zinc element, bismuth element, nickel element and titanium element. The amount of other elements in the alloy is not more than 10 wt %. The aluminum plate 18 is preferably made of pure aluminum but may contain small amounts of other elements because it is difficult to manufacture completely pure aluminum from the viewpoint of smelting technology.

The aluminum plate 18 is not limited in its composition, and conventionally known materials (e.g., JIS A 1050, JIS A 1100, JIS A 3103 and JIS A 3005) can be appropriately used.

The aluminum plate 18 preferably has a width of about 400 to about 2,000 mm and a thickness of about 0.1 to about 0.6 mm. The width and thickness may be changed as appropriate based on such considerations as the size of the printing press, the size of the printing plate and the desires of the user.

[Anodized Film]

The anodized film 20*a* refers to a film that is generally formed on a surface of the aluminum plate 18 by anodizing treatment and preferably has the micropores 22*a* which are substantially vertical to the film surface and are individually distributed in a uniform manner. The micropores 22*a* extend from the surface of the anodized film 20*a* on the image recording layer 16 side (i.e., the surface of the anodized film 20*a* on the side opposite from the aluminum plate 18) in the thickness direction of the film (toward the aluminum plate 18 side).

The micropores 22*a* in the anodized film 20*a* have an average diameter (average aperture size) of preferably 10 to 150 nm and more preferably 10 to 100 nm at the surface of the anodized film. In particular, the average diameter is even more preferably 15 to 60 nm, particularly preferably 20 to 50 nm and most preferably 25 to 40 nm for the sake of the balance between scumming resistance and image visibility. The same effects can be obtained even if the inner diameters of the pores are larger or smaller than the diameters at the surface.

The average diameter of the micropores 22*a* is determined as follows: The surface of the anodized film 20*a* is observed with a field emission scanning electron microscope (FE-SEM) at a magnification of 150,000× to obtain four images (N=4), in the resulting four images, the diameters of the micropores within an area of 400×600 $nm^2$ are measured, and the average of the measurements is calculated.

The equivalent circle diameter is used if the shape of the micropores 22*a* is not circular. The "equivalent circle diameter" refers to the diameter of a circle assuming that the shape of the aperture is the circle having the same projected area as that of the aperture.

The depth of the micropores 22*a* is not particularly limited and is preferably 10 to 3,000 nm, more preferably 50 to 2,000 nm and even more preferably 300 to 1,600 nm.

The depth is determined by taking a cross-sectional image of the anodized film 20*a* (at a magnification of 150,000×), measuring the depths of at least 25 micropores 22*a*, and calculating the average of the measurements.

The shape of the micropores 22*a* is not particularly limited. While the shape is a substantially straight tubular shape (substantially columnar shape) in FIG. 2, it may be a conical shape in which the diameter decreases in the depth direction (thickness direction). The bottom shape of the micropores 22*a* is not particularly limited and may be curved (convex) or flat.

[Undercoat Layer]

The undercoat layer 14 is a layer disposed between the aluminum support 12*a* and the image recording layer 16 and improves the adhesion therebetween. As described above, the undercoat layer 14 is provided as needed and is not essential for the lithographic printing plate precursor.

The undercoat layer is not particularly limited in structure and preferably contains polyvinylphosphonic acid for the purpose of suppressing ink adhesion in non-image portions while maintaining a press life.

For polyvinylphosphonic acid, those disclosed in U.S. Pat. Nos. 3,276,868, 4,153,461 and 4,689,272 can be used.

The undercoat layer is not particularly limited in structure and preferably contains a compound having a betaine structure because this results in excellent scumming resistance and deinking ability.

The betaine structure refers to a structure having at least one cation and at least one anion. The number of cations and the number of anions are typically the same, so that the structure is to be neutral as a whole; in the present invention, a structure having a necessary amount of counter-ions to cancel out the charge when the number of cations and the number of anions are different is also defined as the betaine structure.

The betain structure is preferably one of the structures expressed by Formula (1), Formula (2) and Formula (3) shown below.

[Chemical Formula 1]

Formula (1)

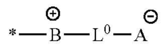

Formula (2)

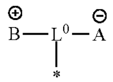

Formula (3)

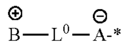

In Formulae, $A^-$ represents a structure having an anion, $B^+$ represents a structure having a cation, and $L^0$ represents a linking group. * represents a linkage moiety (linkage position).

$A^-$ preferably represents a structure having an anion such as carboxylate, sulfonate, phosphonate or phosphinate, and $B^+$ preferably represents a structure having a cation such as ammonium, phosphonium, iodonium or sulfonium.

$L^0$ represents a linking group. In Formulae (1) and (3), one example of $L^0$ is a divalent linking group, and preferred examples thereof include —CO—, —O—, —NH—, a divalent aliphatic group, a divalent aromatic group, and combinations thereof. In Formula (2), one example of $L^0$ is a trivalent linking group.

The linking group above is preferably one having up to 30 carbon atoms including the number of carbon atoms in a substituent that is optionally contained, which will be described later.

Specific examples of the linking group include alkylene groups (having preferably 1 to 20 carbon atoms and more preferably 1 to 10 carbon atoms), and arylene groups (having preferably 5 to 15 carbon atoms and more preferably 6 to 10 carbon atoms) such as a phenylene group and a xylylene group.

Those linking group may further have a substituent.

Examples of the substituent include a halogen atom, a hydroxyl group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

For the betaine structure, the structure expressed by Formula (i), Formula (ii) or Formula (iii) is preferred, and the structure expressed by Formula (i) is more preferred, because at least one of a press life, scumming resistance, deinking ability and image visibility can be more excellent (hereinafter also simply referred to as "because the effects of the invention can be more excellent"). * represents a linkage moiety.

[Chemical Formula 2]

(i)

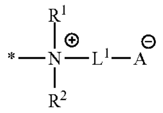

(ii)

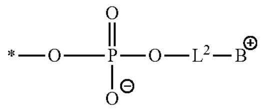

(iii)

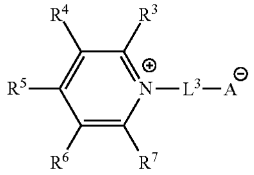

In Formula (i), $R^1$ and $R^2$ each independently represent a hydrogen atom, an alkyl group, an alkenyl group, an alkynyl group, an aryl group or a heterocyclic group; $R^1$ and $R^2$ may be bonded together to form a ring structure.

The ring structure may include a heteroatom such as an oxygen atom. For the ring structure, a 5- to 10-membered ring is preferred, and a 5- or 6-membered ring is more preferred.

The number of carbon atoms in $R^1$ and $R^2$ is preferably 1 to 30 and more preferably 1 to 20.

For $R^1$ and $R^2$, a hydrogen atom, a methyl group and an ethyl group are preferred because the effects of the invention can be more excellent.

$L^1$ represents a divalent linking group, and preferred examples thereof include —CO—, —O—, —NH—, a divalent aliphatic group (e.g., alkylene group), a divalent aromatic group (e.g., phenylene group), and combinations thereof.

For $L^1$, a linear alkylene group having 3 to 5 carbon atoms is preferred.

In Formula (i), $A^-$ represents a structure having an anion, and preferred examples thereof include carboxylate, sulfonate, phosphonate and phosphinate.

Specifically, examples thereof include the following structures.

[Chemical Formula 3]

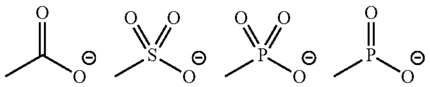

Formula (i) has preferably a combination of $L^1$ being a linear alkylene group having 4 or 5 carbon atoms and $A^-$ being sulfonate, and more preferably a combination of $L^1$ being a linear alkylene group having 4 carbon atoms and $A^-$ being sulfonate.

In Formula (ii), $L^2$ represents a divalent linking group, and preferred examples thereof include —CO—, —O—, —NH—, a divalent aliphatic group (e.g., alkylene group), a divalent aromatic group (e.g., phenylene group), and combinations thereof.

$B^+$ represents a structure having a cation, and a structure having ammonium, phosphonium, iodonium or sulfonium is preferred. Of these, a structure having ammonium or phosphonium is preferred, and a structure having ammonium is more preferred.

Examples of the structure having a cation include a trimethylammonio group, a triethylammonio group, a tributylammonio group, a benzyldimethylammonio group, a diethylhexylammonio group, a (2-hydroxyethyl)dimethylammonio group, a pyridinio group, an N-methylimidazolio group, an N-acridinio group, a trimethylphosphonio group, a triethylphosphonio group and a triphenylphosphonio group.

In Formula (iii), $L^3$ represents a divalent linking group, and preferred examples thereof include —CO—, —O—, —NH—, a divalent aliphatic group (e.g., alkylene group), a divalent aromatic group (e.g., phenylene group), and combinations thereof.

$A^-$ represents a structure having an anion, and preferred examples thereof include carboxylate, sulfonate, phosphonate and phosphinate. The details and preferred examples thereof are the same as those for $A^-$ in Formula (i).

$R^3$ to $R^7$ each independently represent a hydrogen atom or a substituent (having preferably 1 to 30 carbon atoms), and at least one of $R^3$ to $R^7$ represents a linkage moiety.

At least one of $R^3$ to $R^7$ being a linkage moiety may be bonded to another moiety in the compound via a substituent which is at least one of $R^3$ to $R^7$ or directly bonded to another moiety in the compound by a single bond.

Examples of the substituent represented by $R^3$ to $R^7$ include a halogen atom, alkyl groups (including a cycloalkyl group and a bicycloalkyl group), alkenyl groups (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, amino groups (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group and a silyl group.

The compound above is preferably a polymer including a repeating unit having the betaine structure (hereinafter also simply called "specific polymer") because the effects of the invention can be more excellent. For the repeating unit having the betaine structure, the repeating unit expressed by Formula (A1) is preferred.

[Chemical Formula 4]

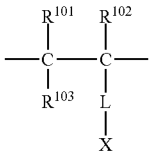

(A1)

In the formula, $R^{101}$ to $R^{103}$ each independently represent a hydrogen atom, an alkyl group or a halogen atom. L represents a single bond or a divalent linking group.

Examples of the divalent linking group include —CO—, —O—, —NH—, a divalent aliphatic group, a divalent aromatic group, and combinations thereof.

Specific examples of the combinations constituting L are shown below. Note that, in the following examples, the left side is bonded to the main chain and the right side is bonded to X.

L1: —CO—O-divalent aliphatic group-

L2: —CO—O-divalent aromatic group-

L3: —CO—NH-divalent aliphatic group-

L4: —CO—NH-divalent aromatic group-

L5: —CO-divalent aliphatic group-

L6: —CO-divalent aromatic group-

L7: —CO-divalent aliphatic group-CO—O-divalent aliphatic group-

L8: —CO-divalent aliphatic group-O—CO-divalent aliphatic group-

L9: —CO-divalent aromatic group-CO—O-divalent aliphatic group-

L10: —CO-divalent aromatic group-O—CO-divalent aliphatic group-

L11: —CO-divalent aliphatic group-CO—O-divalent aromatic group-

L12: —CO-divalent aliphatic group-O—CO-divalent aromatic group-

L13: —CO-divalent aromatic group-CO—O-divalent aromatic group-

L14: —CO-divalent aromatic group-O—CO-divalent aromatic group-

L15: —CO—O-divalent aromatic group-O—CO—NH-divalent aliphatic group-

L16: —CO—O-divalent aliphatic group-O—CO—NH-divalent aliphatic group-

Examples of the divalent aliphatic group include an alkylene group, an alkenylene group and an alkynylene group.

Examples of the divalent aromatic group include aryl groups, and preferred are a phenylene group and a naphthylene group.

X represents the betaine structure. X is preferably one of the structures expressed by Formula (i), Formula (ii) and Formula (iii) shown above.

In particular, Formula (A1) preferably has a combination of L being L1 or L3, X being the structure expressed by Formula (i), and $A^-$ in Formula (i) being a sulfonate group.

The amount of the repeating unit having the betaine structure in the specific polymer is not particularly limited and is usually 20 to 95 wt %; the amount is preferably 50 to 95 wt % and more preferably 60 to 90 wt % with respect to the total amount of all repeating units constituting the specific polymer because the effects of the invention can be more excellent.

The specific polymer may include another repeating unit in addition to the repeating unit having the betaine structure.

The specific polymer may include a repeating unit having a structure that interacts with a surface of the aluminum support 12*a* (hereinafter also simply called "interacting structure").

Examples of the interacting structure include a carboxylic acid structure, a carboxylic acid salt structure, a sulfonic acid structure, a sulfonic acid salt structure, a phosphonic acid structure, a phosphonic acid salt structure, a phosphate ester structure, a phosphate ester salt structure, a β-diketone structure and a phenolic hydroxyl group, as exemplified by the structures expressed by the formulae shown below. Of these, a carboxylic acid structure, a carboxylic acid salt structure, a sulfonic acid structure, a sulfonic acid salt structure, a phosphonic acid structure, a phosphonic acid salt structure, a phosphate ester structure, and a phosphate ester salt structure are preferred.

[Chemical Formula 5]

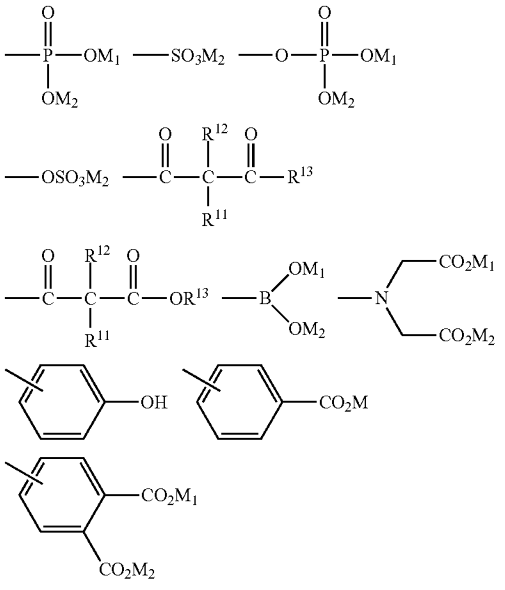

In the formulae above, $R^{11}$ to $R^{13}$ each independently represent a hydrogen atom, an alkyl group, an aryl group, an alkynyl group or an alkenyl group, and M, $M_1$ and $M_2$ each independently represent a hydrogen atom, a metal atom (e.g., an alkali metal atom such as Na or Li) or an ammonium group. B represents a boron atom.

For the repeating unit having the interacting structure, the repeating unit expressed by Formula (A2) is preferred.

[Chemical Formula 6]

(A2)

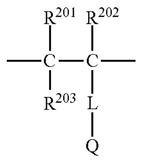

In the formula, $R^{201}$ to $R^{203}$ each independently represent a hydrogen atom, an alkyl group (preferably having 1 to 6 carbon atoms) or a halogen atom.

L represents a single bond or a divalent linking group. Examples of the divalent linking group include —CO—, —O—, —NH—, a divalent aliphatic group, a divalent aromatic group, and combinations thereof.

Specific examples of the combinations constituting L include, in addition to those stated for Formula (A1) above, L17 and L18 below.

L17: —CO—NH—

L18: —CO—O—

Among L1 to L18, L1 to L4, L17 and L18 are preferred.

Q represents the interacting structure, and preferred examples thereof are the same as those listed above.

The amount of the repeating unit having the interacting structure in the specific polymer is not particularly limited and is preferably 1 to 40 wt % and more preferably 3 to 30 wt % with respect to the total amount of all repeating units constituting the specific polymer because the effects of the invention can be more excellent.

The specific polymer may include a repeating unit having a radical polymerizable reactive group.

Examples of the radical polymerizable reactive group include addition-polymerizable, unsaturated bond groups (e.g., a (meth)acryloyl group, a (meth)acrylamide group, a (meth)acrylonitrile group, an allyl group, a vinyl group, a vinyloxy group and an alkynyl group) and chain-transferable, functional groups (e.g., a mercapto group).

The specific polymer including the repeating unit having the radical polymerizable reactive group can be obtained by introducing the radical polymerizable reactive group by the method described in JP 2001-312068 A. The use of the specific polymer including the repeating unit having the radical polymerizable reactive group makes it possible to achieve excellent developability in unexposed portions, while polymerization serves to suppress permeability of a developer in exposed portions, thus further improving bonding properties and adhesion between the aluminum support 12*a* and the image recording layer 16.

The amount of the repeating unit having the radical polymerizable reactive group in the specific polymer is not particularly limited and is preferably 1 to 30 wt % and more preferably 3 to 20 wt % with respect to the total amount of all repeating units constituting the specific polymer because the effects of the invention can be more excellent.

The amount of the compound having the betaine structure in the undercoat layer 14 is not particularly limited and is preferably not less than 80 wt % and more preferably not less than 90 wt % with respect to the total weight of the undercoat layer. The upper limit thereof is, for instance, 100 wt %.

While the undercoat layer 14 containing the compound having the betain structure is described in the foregoing, an undercoat layer containing another compound may be employed.

For example, an undercoat layer containing a compound having a hydrophilic group may be employed. Examples of the hydrophilic group include a carboxylic acid group and a sulfonic acid group.

The compound having the hydrophilic group may further have a radical polymerizable reactive group.

[Image Recording Layer]

The image recording layer 16 is preferably one that is removable with printing ink and/or fountain solution.

The constituents of the image recording layer 16 are described below.

<Infrared Absorber>

The image recording layer 16 preferably includes an infrared absorber.

The infrared absorber preferably has an absorption maximum in a wavelength range from 750 to 1,400 nm. In particular, when the lithographic printing plate precursor is of on-press development type, on-press development is sometimes carried out with a printing press under a white lamp; thus, the use of the infrared absorber having an absorption maximum in a wavelength range from 750 to 1,400 nm, which is hardly influenced by a white lamp, makes it possible to obtain a lithographic printing plate precursor having excellent developability.

For the infrared absorber, a dye or a pigment is preferred.

Usable dyes include commercial dyes and known dyes that are mentioned in the technical literature, such as Senryo Binran [Handbook of Dyes] (The Society of Synthetic Organic Chemistry, Japan, 1970).

Specific examples of the dye include cyanine dyes, squarylium dyes, pyrylium salts, nickel-thiolate complexes and indolenine cyanine dyes. Of these, preferred are cyanine dyes and indolenine cyanine dyes, more preferred are cyanine dyes, and even more preferred are cyanine dyes expressed by Formula (a) below.

[Chemical Formula 7]

Formula (a)

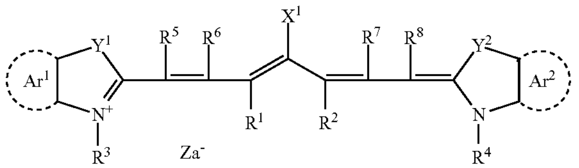

In Formula (a), $X^1$ represents a hydrogen atom, a halogen atom, —N($R^9$) ($R^{10}$), —$X^2$-$L^1$ or the following group.

[Chemical Formula 8]

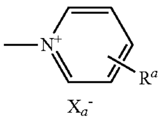

$R^9$ and $R^{10}$ each independently represent an aromatic hydrocarbon group, an alkyl group or a hydrogen atom; $R^9$ and $R^{10}$ may be bonded together to form a ring. In particular, a phenyl group is preferred.

$X^2$ represents an oxygen atom or a sulfur atom, and $L^1$ represents a hydrocarbon group having 1 to 12 carbon atoms and optionally a heteroatom (N, S, O, a halogen atom, Se).

$X_a^-$ is defined in the same way as $Z_a^-$ described below, and $R^a$ represents a hydrogen atom, an alkyl group, an aryl group, an amino group or a halogen atom.

$R^1$ and $R^2$ each independently represent a hydrocarbon group having 1 to 12 carbon atoms. $R^1$ and $R^2$ may be bonded together to form a ring, and the ring formed is preferably a 5- or 6-membered ring.

$Ar^1$ and $Ar^2$ each independently represent an aromatic hydrocarbon group optionally having a substituent (e.g., an alkyl group). For the aromatic hydrocarbon group, a benzene ring group and a naphthalene ring group are preferred.

$Y^1$ and $Y^2$ each independently represent a sulfur atom or a dialkylmethylene group having up to 12 carbon atoms.

$R^3$ and $R^4$ each independently represent a hydrocarbon group having up to 20 carbon atoms and optionally a substituent (e.g., an alkoxy group).

$R^5$, $R^6$, $R^7$ and $R^8$ each independently represent a hydrogen atom or a hydrocarbon group having up to 12 carbon atoms.

$Za^-$ represents a counteranion. In cases where the cyanine dye expressed by Formula (a) has an anionic substituent in the structure and there is no need for charge neutralization, $Za^-$ is unnecessary. Examples of $Za^-$ include halide ion, perchlorate ion, tetrafluoroborate ion, hexafluorophosphate ion and sulfonate ion; and perchlorate ion, hexafluorophosphate ion and arylsulfonate ion are preferred.

The foregoing infrared absorbing dyes may be used alone or in combination of two or more thereof, or in combination with infrared absorbers other than the infrared absorbing dyes such as pigments. Exemplary pigments that may be preferably used include compounds described in paragraphs [0072] to [0076] of JP 2008-195018 A.

The infrared absorber content is preferably from 0.05 to 30 wt % and more preferably from 0.1 to 20 wt % with respect to the total weight of the image recording layer 16.

<Polymerization Initiator>

The image recording layer 16 preferably includes a polymerization initiator.

The polymerization initiator is preferably a compound that generates a radical under light or heat energy or both and initiates polymerization of a compound having a polymerizable unsaturated group (so-called radical polymerization initiator). Examples of the polymerization initiator include photopolymerization initiators and thermal polymerization initiators.

Specifically, for the polymerization initiator, polymerization initiators described in paragraphs [0115] to [0141] of JP 2009-255434 A may be used.

For the polymerization initiator, oxime ester compounds and onium salts such as diazonium salts, iodonium salts and sulfonium salts are preferred for the sake of reactivity and stability.

The polymerization initiator content is preferably from 0.1 to 50 wt % and more preferably from 0.5 to 30 wt % with respect to the total weight of the image recording layer 16.

<Polymerizable Compound>

The image recording layer 16 preferably includes a polymerizable compound.

The polymerizable compound is preferably an addition polymerizable compound having at least one ethylenically unsaturated bond. In particular, a compound having at least one (preferably at least two) terminal ethylenically unsaturated bond is more preferred. A so-called radical polymerizable compound is more preferred.

For the polymerizable compound, for instance, polymerizable compounds described in paragraphs [0142] to [0163] of JP 2009-255434 A may be used.

Addition polymerizable urethane compounds produced using an addition reaction between an isocyanate group and a hydroxyl group are also suitable. Specific examples thereof include vinylurethane compounds having two or more polymerizable vinyl groups in the molecule that are obtained by adding a hydroxyl group-bearing vinyl monomer of Formula (A) below to the polyisocyanate compounds having two or more isocyanate groups in the molecule mentioned in JP 48-41708 B.

$$CH_2{=}C(R^4)COOCH_2CH(R^5)OH \qquad (A)$$

(wherein $R^4$ and $R^5$ are H or $CH_3$).

The polymerizable compound content is preferably from 3 to 80 wt % and more preferably from 10 to 75 wt % with respect to the total weight of the image recording layer 16.

<Binder Polymer>

The image recording layer 16 preferably includes a binder polymer.

Examples of the binder polymer include known binder polymers. Specific examples of such binder polymers include acrylic resins, polyvinyl acetal resins, polyurethane resins, polyurea resins, polyimide resins, polyamide resins, epoxy resins, methacrylic resins, polystyrene resins, novolac-type phenolic resins, polyester resins, synthetic rubbers and natural rubbers.

Crosslinkability may be imparted to the binder polymer to enhance the film strength in image portions. To impart crosslinkability to the binder polymer, a crosslinkable functional group such as an ethylenically unsaturated bond may be introduced into the polymer main chain or side chain. The crosslinkable functional group may be introduced by copolymerization.

For the binder polymer, for instance, binder polymers disclosed in paragraphs [0165] to [0172] of JP 2009-255434 A may be used.

The binder polymer content is preferably from 5 to 90 wt % and more preferably from 5 to 70 wt % with respect to the total weight of the image recording layer 16.

<Surfactant>

The image recording layer 16 may contain a surfactant in order to promote on-press developability at the start of printing and improve the coating surface state.

Exemplary surfactants include nonionic surfactants, anionic surfactants, cationic surfactants, amphoteric surfactants and fluorosurfactants.

For the surfactant, for example, surfactants disclosed in paragraphs [0175] to [0179] of JP 2009-255434 A may be used.

The surfactant content is preferably from 0.001 to 10 wt % and more preferably from 0.01 to 5 wt % with respect to the total weight of the image recording layer 16.

The image recording layer 16 may also optionally contain various other compounds than those mentioned above.

Examples of other compounds include colorants, printing-out agents, polymerization inhibitors, higher fatty acid derivatives, plasticizers, inorganic fine particles and low-molecular-weight hydrophilic compounds, which are disclosed in paragraphs [0181] to [0190] of JP 2009-255434 A.

Further examples of other compounds include hydrophobilizing precursors (fine particles capable of converting the image recording layer to be hydrophobic when heat is applied), low-molecular-weight hydrophilic compounds, sensitizers (e.g., phosphonium compounds, nitrogen-containing low-molecular-weight compounds, ammonium group-bearing polymers), chain transfer agents, borate compounds and acid color formers, which are disclosed in paragraphs [0191] to [0217] of JP 2012-187907 A.

The acid color former refers to a compound having properties of developing a color when heat is applied under the state where the compound has accepted an electron-accepting compound (e.g., a proton of an acid or the like). Preferred examples of the acid color former include colorless compounds that have a partial skeleton such as lactone, lactam, sultone, spiropyran, ester or amide and that, upon contact with an electron-accepting compound, exhibit immediate ring-opening or cleavage of the partial skeleton. The acid color former is preferably at least one compound selected from the group consisting of spiropyran compounds, spirooxazine compounds, spirolactone compounds and spirolactam compounds.

The image recording layer may contain a polymeric compound in the form of fine particles and may contain thermoplastic polymer particles.

Exemplary polymers constituting the thermoplastic polymer particles include homopolymers or copolymers of monomers such as ethylene, styrene, vinyl chloride, methyl acrylate, ethyl acrylate, methyl methacrylate, ethyl methacrylate, vinylidene chloride, acrylonitrile, vinyl carbazole, acrylate having a polyalkylene structure, and methacrylate having a polyalkylene structure, and mixtures thereof. Of these, polystyrene, copolymers containing styrene and acrylonitrile, and polymethyl methacrylate are preferred.

[Other Layers]

The lithographic printing plate precursor of the invention may include other layers in addition to the aluminum support 12*a*, the undercoat layer 14 and the image recording layer 16 described above.

For instance, the lithographic printing plate precursor may optionally include a protective layer formed on the image recording layer 16 to prevent scuffing and other damage to the image recording layer 16, to serve as an oxygen barrier, and to prevent ablation during exposure with a high-intensity laser beam.

Exemplary materials that may be used for the protective layer include those described, for example, in paragraphs [0213] to [0227] of JP 2009-255434 A (e.g., water-soluble polymer compounds and inorganic layered compounds).

[Aluminum Support Manufacturing Method]

An aluminum support manufacturing method of the invention is a method of manufacturing an aluminum support used in the lithographic printing plate precursor of the invention described above.

The aluminum support manufacturing method of the invention includes a hydrochloric acid electrolytic treatment step in which an aluminum plate is subjected to alternating current electrolysis in a hydrochloric acid treatment solution having a hydrochloric acid concentration of 0.1 to 2.0 g/L, thereby manufacturing a surface-roughened aluminum plate.

In the aluminum support manufacturing method of the invention, the hydrochloric acid electrolytic treatment step is preferably followed by an anodizing treatment step in which the surface-roughened aluminum plate is anodized to form an anodized aluminum film on the aluminum plate.

In addition, in the aluminum support manufacturing method of the invention, the anodizing treatment step is preferably followed by a pore-widening treatment step in which the aluminum plate having the anodized film formed thereon is etched to enlarge the diameter of micropores present in the anodized film.

The above steps and optionally performed steps are described in detail below.

[Mechanical Graining Treatment]

In the aluminum support manufacturing method of the invention, the hydrochloric acid electrolytic treatment step may be preceded by mechanical graining treatment.

Exemplary methods of the mechanical graining treatment that may be employed include a wire brush graining method in which an aluminum surface is scratched with a metal wire, a ball graining method in which an aluminum surface is grained with abrasive balls and an abrasive, and a brush graining method in which a surface is grained with a nylon brush and an abrasive as described in JP 6-135175 A and JP 50-40047 B.

[Hydrochloric Acid Electrolytic Treatment Step]

The hydrochloric acid electrolytic treatment step included in the aluminum support manufacturing method of the invention is a step in which an aluminum plate is subjected to alternating current electrolysis in a hydrochloric acid treatment solution having a sulfuric acid concentration of 0.1 to 2.0 g/L, thereby manufacturing a surface-roughened aluminum plate.

In the present invention, owing to the hydrochloric acid electrolytic treatment as above and anodizing treatment to be described below, the surface of the aluminum support on the image recording layer side has the specific pits at a density of at least 3,000 pits/$mm^2$.

In the present invention, the hydrochloric acid treatment solution has a sulfuric acid concentration of preferably 0.1 to 1.5 g/L and more preferably 0.2 to 1.5 g/L.

Sinusoidal, square, trapezoidal and triangular waveforms are applicable as an AC power source waveform for hydrochloric acid electrolytic treatment. The frequency is preferably from 0.1 to 250 Hz.

Figure 3:
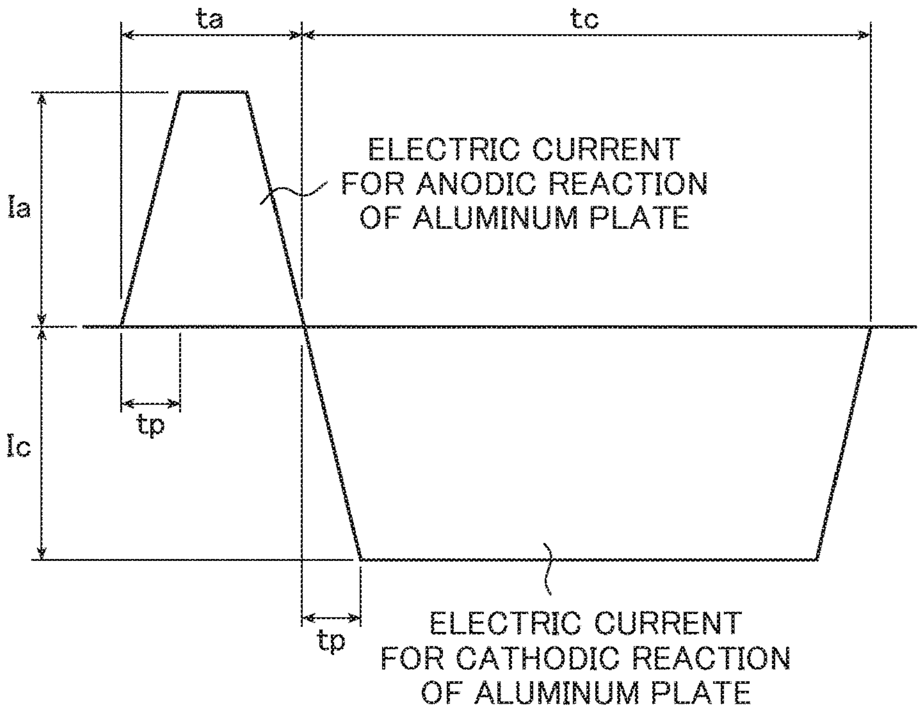
FIG. 3 is a graph showing an example of an alternating current waveform that may be used in electrochemical graining treatment in a method of manufacturing the aluminum support.

FIG. 3 is a graph showing an example of an alternating current waveform that may be used in hydrochloric acid electrolytic treatment.

In FIG. 3, "ta" represents the anodic reaction time, "tc" the cathodic reaction time, "tp" the time required for the current to reach a peak from zero, "Ia" the peak current on the anode cycle side, and "Ic" the peak current on the cathode cycle side. In the trapezoidal waveform, it is preferable for the time tp until the current reaches a peak from zero to be from 1 to 10 ms. One cycle of alternating current that may be used in hydrochloric acid electrolytic treatment preferably satisfies the following conditions: the ratio of the cathodic reaction time tc to the anodic reaction time ta in the aluminum plate (tc/ta) is from 1 to 20; the ratio of the amount of electricity Qc when the aluminum plate serves as a cathode to the amount of electricity Qa when it serves as an anode (Qc/Qa) is from 0.3 to 20; and the anodic reaction time ta is from 5 to 1,000 ms. The current density as a peak value in the trapezoidal waveform is preferably from 10 to 200 A/$dm^2$ for both of the anode cycle side value Ia and the cathode cycle side value Ic. The ratio Ic/Ia is preferably in a range of 0.3 to 20.

In the present invention, the total amount of electricity furnished for the anodic reaction on the aluminum plate up until completion of hydrochloric acid electrolytic treatment is preferably from 25 to 1,000 C/$dm^2$, and because the specific pits are more easily formed, preferably 350 to 1,000 C/$dm^2$.

Figure 4:
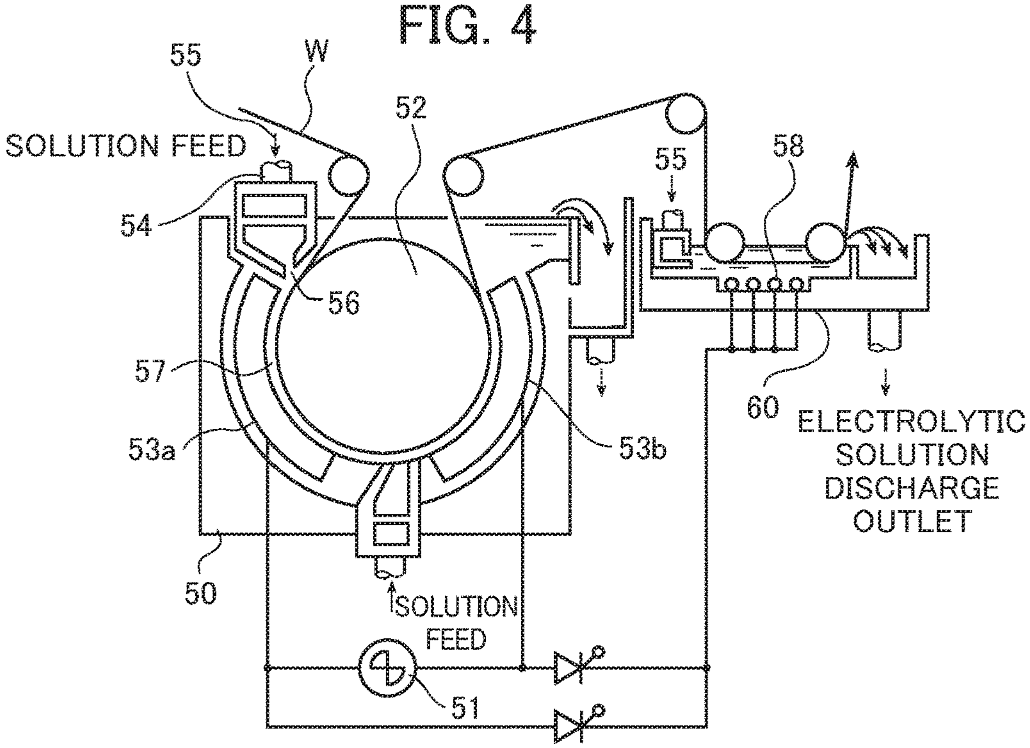
FIG. 4 is a side view showing an example of a radial cell in electrochemical graining treatment using alternating current in the method of manufacturing the aluminum support.

An apparatus shown in FIG. 4 may be used for hydrochloric acid electrolytic treatment using alternating current.

FIG. 4 is a side view showing an example of a radial cell in hydrochloric acid electrolytic treatment using alternating current.

FIG. 4 shows a main electrolytic cell 50, an AC power source 51, a radial drum roller 52, main electrodes 53*a* and 53*b*, an electrolytic solution feed inlet 54, an electrolytic solution 55, a slit 56, an electrolytic solution channel 57, auxiliary anodes 58, an auxiliary anode cell 60 and an aluminum plate W. When two or more electrolytic cells are used, electrolysis may be performed under the same or different conditions.

The aluminum plate W is wound around the radial drum roller 52 disposed to be immersed in the electrolytic solution within the main electrolytic cell 50 and is electrolyzed by the main electrodes 53*a* and 53*b* connected to the AC power source 51 as it travels. The electrolytic solution 55 is fed from the electrolytic solution feed inlet 54 through the slit 56 to the electrolytic solution channel 57 between the radial drum roller 52 and the main electrodes 53*a* and 53*b*. The aluminum plate W treated in the main electrolytic cell 50 is then electrolyzed in the auxiliary anode cell 60. In the auxiliary anode cell 60, the auxiliary anodes 58 are disposed in a face-to-face relationship with the aluminum plate W so that the electrolytic solution 55 flows through the space between the auxiliary anodes 58 and the aluminum plate W.

[Alkali Etching Treatment]

In the aluminum support manufacturing method of the invention, alkali etching treatment is preferably carried out after the above-described mechanical graining treatment in cases the mechanical graining treatment is performed, or before or after the above-described hydrochloric acid electrolytic treatment.

The purpose of the alkali etching treatment carried out before the hydrochloric acid electrolytic treatment is to remove substances such as rolling oil, contaminants and a naturally oxidized film from a surface of an aluminum substrate (rolled aluminum) in cases where no mechanical graining treatment is carried out, and to dissolve edges of asperities formed by the mechanical graining treatment to thereby change the surface with sharp edges of the asperities into the surface with smooth curves in cases where the mechanical graining treatment has been carried out.

When no mechanical graining treatment is carried out before the alkali etching treatment, the amount of etching is preferably 0.1 to 10 g/$m^2$ and more preferably 1 to 5 g/$m^2$. When the amount of etching is 1 to 10 g/$m^2$, substances such as rolling oil, contaminants and a naturally oxidized film can be sufficiently removed from the surface.

When the mechanical graining treatment is carried out before the alkali etching treatment, the amount of etching is preferably 3 to 20 g/$m^2$ and more preferably 5 to 15 g/$m^2$.

The purpose of the alkali etching treatment carried out immediately after the hydrochloric acid electrolytic treatment is to dissolve smut that arises in an acidic electrolytic solution and to dissolve edges of asperities formed by the hydrochloric acid electrolytic treatment. The asperities formed by the hydrochloric acid electrolytic treatment vary depending on the type of the electrolytic solution, and accordingly, the optimal amount of etching also varies; however, the amount of etching in the alkali etching treatment carried out after the hydrochloric acid electrolytic treatment is preferably 0 to 0.5 g/$m^2$ and more preferably 0 to 0.1 g/$m^2$.

Alkalis that may be used in an alkali solution are exemplified by caustic alkalis and alkali metal salts. An aqueous solution of sodium hydroxide is especially preferred.

The concentration of the alkali solution may be determined in accordance with the amount of etching and is preferably 1 to 50 wt % and more preferably 10 to 35 wt %. When aluminum ions are dissolved in the alkali solution, the aluminum ion concentration is preferably 0.01 to 10 wt % and more preferably 3 to 8 wt %. The alkali solution preferably has a temperature of 20° C. to 90° C. The treatment time is preferably from 0 to 120 seconds.

Illustrative examples of methods for bringing the aluminum substrate into contact with the alkali solution include passing the aluminum substrate through a tank filled with the alkali solution, immersing the aluminum substrate in a tank filled with the alkali solution, and spraying the surface of the aluminum substrate with the alkali solution.

[Desmutting Treatment]

In the aluminum support manufacturing method of the invention, the hydrochloric acid electrolytic treatment or the alkali etching treatment is preferably followed by acid pickling (desmutting treatment) to remove corrosion products remaining on the surface.

Typical examples of acid that may be used include nitric acid, sulfuric acid and hydrochloric acid, and other acids are also applicable.

The desmutting treatment is carried out by bringing the aluminum substrate into contact with an acidic solution having a concentration of hydrochloric acid, nitric acid, sulfuric acid or the like of 0.5 to 30 wt % (containing 0.01 to 5 wt % aluminum ions), for instance.

Illustrative examples of methods for bringing the aluminum substrate into contact with the acidic solution include passing the aluminum substrate through a tank filled with the acidic solution, immersing the aluminum substrate in a tank filled with the acidic solution, and spraying the surface of the aluminum substrate with the acidic solution.

The surface state of the aluminum substrate having undergone the desmutting treatment influences the growth of a naturally oxidized film that follows, and therefore, the type of acid and the concentration and temperature conditions are suitably selected according to the intended purpose.

[Rinsing with Water]

In the aluminum support manufacturing method of the invention, each of the above-described treatments is preferably followed by rinsing with water. In particular, rinsing with water carried out after a series of the steps influences the growth of a naturally oxidized film that follows, and therefore, it is necessary to perform thorough rinsing with pure water, well water, tap water or the like.

[Anodizing Treatment Step]

The anodizing treatment step is a step in which, after the above-described hydrochloric acid electrolytic treatment step, the surface-roughened aluminum plate is anodized to form an anodized aluminum film on the aluminum plate.

The procedure of the anodizing treatment step is not particularly limited, and any known method may be employed.

In the anodizing treatment step, aqueous solutions of acids such as sulfuric acid, phosphoric acid and oxalic acid may be used for the electrolytic bath. The concentration of sulfuric acid is for instance from 100 to 300 g/L.

The anodizing treatment conditions are appropriately set in accordance with an electrolytic solution employed. Exemplary conditions are as follows: a solution temperature of from 5° C. to 70° C. (preferably from 10° C. to 60° C.), a current density of from 0.5 to 60 $A/dm^2$ (preferably from 5 to 60 $A/dm^2$), a voltage of from 1 to 100 V (preferably from 5 to 50 V), an electrolysis time of from 1 to 100 seconds (preferably from 5 to 60 seconds), and a film weight of from 0.1 to 5 $g/m^2$ (preferably from 0.2 to 3 $g/m^2$).

In the present invention, the anodizing treatment step is preferably a step of carrying out anodizing treatment using phosphoric acid because this improves adhesion between the aluminum support and an image recording layer.

[Pore-Widening Treatment Step]

The pore-widening treatment step is a step in which, after the above-described anodizing treatment step, the aluminum plate having the anodized film formed thereon is etched for enlarging the diameter of micropores present in the anodized film (pore size-enlarging treatment step).

The pore-widening treatment can be performed by contacting the aluminum plate obtained by the above-described anodizing treatment step with an aqueous acid or alkali solution. Examples of the contacting method include, but are not limited to, immersion and spraying.

[Lithographic Printing Plate Precursor Manufacturing Method]

The method of manufacturing the above-described lithographic printing plate precursor of the invention is preferably a method in which after the above-described aluminum support manufacturing method of the invention, the following steps are performed in order.

(Undercoat layer formation step) Step of forming an undercoat layer on the aluminum support obtained in the pore-widening treatment step;

(Image recording layer formation step) Step of forming an image recording layer on the undercoat layer.

The procedure of each step is described in detail below.

[Undercoat Layer Formation Step]

The undercoat layer formation step is a step of forming an undercoat layer on the aluminum support obtained in the pore-widening treatment step.

The undercoat layer manufacturing method is not particularly limited, and examples thereof include a method involving applying an undercoat layer-forming coating liquid containing a predetermined compound (e.g., the compound having the betaine structure) onto the anodized film on the aluminum support.

The undercoat layer-forming coating liquid preferably includes a solvent. Examples of the solvent include water and organic solvents.

Exemplary methods of applying the undercoat layer-forming coating liquid include various known application methods. Specific Examples thereof include bar coating, spin coating, spray coating, curtain coating, dip coating, air knife coating, blade coating and roll coating.

The coating weight (solids content) of the undercoat layer is preferably from 0.1 to 100 $mg/m^2$ and more preferably from 1 to 50 $mg/m^2$.

[Image Recording Layer Formation Step]

The image recording layer formation step is a step of forming an image recording layer on the undercoat layer.

The image recording layer forming method is not particularly limited, and examples thereof include a method involving applying an image recording layer-forming coating liquid containing predetermined components (such as the infrared absorber, the polymerization initiator and the polymerizable compound as described above) onto the undercoat layer.

The image recording layer-forming coating liquid preferably includes a solvent. Examples of the solvent include water and organic solvents.

For the method of applying the image recording layer-forming coating liquid, the methods listed as exemplary methods of applying the undercoat layer-forming coating liquid may be employed.

The coating weight (solids content) of the image recording layer varies depending on the intended purpose, although an amount of 0.3 to 3.0 $g/m^2$ is generally preferred.

In cases where a protective layer is provided on the image recording layer, the protective layer manufacturing method is not particularly limited, and examples thereof include a method involving applying a protective layer-forming coating liquid containing predetermined components onto the image recording layer.

While the embodiment in which the micropores 22*a* in the anodized film 20*a* have a substantially straight tubular shape is described in the foregoing, micropores may have another structure as long as the average diameter of the micropores at a surface of an anodized film falls within the predetermined range.

Figure 5:
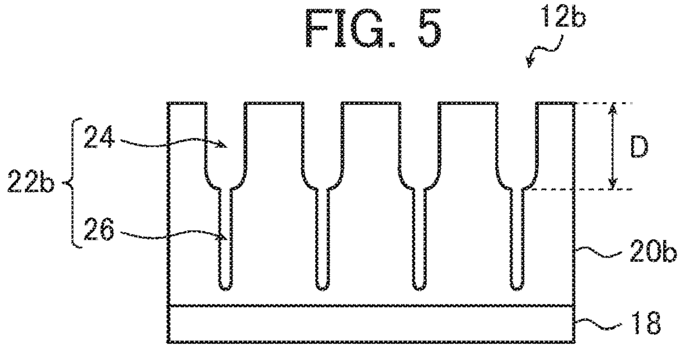
FIG. 5 is a schematic cross-sectional view of another example of the aluminum support.

For instance, as shown in FIG. 5, an embodiment may be employed in which the aluminum support 12*b* includes the aluminum plate 18 and an anodized film 20*b* having micropores 22*b* each made up of a large-diameter portion 24 and a small-diameter portion 26.

Each micropore 22*b* in the anodized film 20*b* has the large-diameter portion 24 which extends to a depth from the anodized film surface of 10 to 1,000 nm (depth D: see FIG. 5) and the small-diameter portion 26 which communicates with the bottom of the large-diameter portion 24 and further extends to a depth from the communication position of 20 to 2,000 nm.

The large-diameter portion 24 and the small-diameter portion 26 are described below in detail.

The average diameter of the large-diameter portions 24 at the surface of the anodized film 20*b* is preferably 10 to 100 nm as with the average diameter of the micropores 22*a* in the anodized film 20*a* at the surface of the anodized film, and more preferably 15 to 60 nm, even more preferably 20 to 50 nm and particularly preferably 25 to 40 nm for the sake of the balance between scumming resistance and image visibility.

The measurement method of the average diameter of the large-diameter portions 24 at the surface of the anodized film 20*b* is the same as that of the average diameter of the micropores 22*a* in the anodized film 20*a* at the surface of the anodized film.

The bottom of each large-diameter portion 24 is at a depth of 10 to 1,000 nm from the surface of the anodized film (hereinafter this depth is also referred to as "depth D"). In other words, each large-diameter portion 24 is a pore portion which extends from the surface of the anodized film in the depth direction (thickness direction) to a depth of 10 to 1,000 nm. The depth is preferably 10 to 200 nm.

The depth is determined by taking a cross-sectional image of the anodized film 20*b* (at a magnification of 150,000×), measuring the depths of at least 25 large-diameter portions 24, and calculating the average of the measurements.

The shape of the large-diameter portions 24 is not particularly limited. Exemplary shapes include a substantially straight tubular shape (substantially columnar shape) and a conical shape in which the diameter decreases in the depth direction (thickness direction), and a substantially straight tubular shape is preferred.

As shown in FIG. 5, each small-diameter portion 26 is a pore portion which communicates with the bottom of the corresponding large-diameter portion 24 and further extends from the communication position in the depth direction (thickness direction).

The small-diameter portions 26 preferably have an average diameter of 13 nm or less at the communication position. In particular, the average diameter is preferably 11 nm or less and more preferably 10 nm or less. The lower limit thereof is not particularly limited and is usually not less than 5 nm.

The average diameter of the small-diameter portions 26 is determined as follows: The surface of the anodized film 20*b* is observed with FE-SEM at a magnification of 150,000× to obtain four images (N=4), in the resulting four images, the diameters of 50 micropores (small-diameter portions) within an area of 400×600 $nm^2$ are measured, and the average of the measurements is calculated. When the depths of the large-diameter portions are large, the average diameter of the small-diameter portions may be determined by cutting out the upper region of the anodized film 20*b* (the region having the large-diameter portions) (for example, by argon gas) and then observing the surface of the anodized film 20*b* with FE-SEM, as needed.

The equivalent circle diameter is used if the shape of the small-diameter portion 26 is not circular. The "equivalent circle diameter" refers to the diameter of a circle assuming that the shape of the aperture is the circle having the same projected area as that of the aperture.

The bottom of each small-diameter portion 26 is at a distance of 20 to 2,000 nm in the depth direction from the position of communication with the corresponding large-diameter portion 24. In other words, the small-diameter portions 26 are pore portions each of which further extends in the depth direction (thickness direction) from the position of communication with the corresponding large-diameter portion 24, and the small-diameter portions 26 have a depth of 20 to 2,000 nm. The depth is preferably 500 to 1,500 nm.

The depth is determined by taking a cross-sectional image of the anodized film 20*b* (at a magnification of 50,000×), measuring the depths of at least 25 small-diameter portions, and calculating the average of the measurements.

The shape of the small-diameter portions 26 is not particularly limited. Exemplary shapes include a substantially straight tubular shape (substantially columnar shape) and a conical shape in which the diameter decreases in the depth direction, and a substantially straight tubular shape is preferred.

The method of manufacturing the aluminum support 12*b* is not particularly limited, and a manufacturing method in which the following steps are performed in order is preferred.

(Hydrochloric acid electrolytic treatment step) Step of performing the above-described hydrochloric acid electrolytic treatment on an aluminum plate;

(First anodizing treatment step) Step of anodizing the aluminum plate having undergone surface roughening treatment;

(Pore-widening treatment step) Step of increasing the diameter of micropores in an anodized film obtained in the first anodizing treatment step by bringing the aluminum plate having the anodized film into contact with an aqueous acid or alkali solution;

(Second anodizing treatment step) Step of anodizing the aluminum plate obtained in the pore-widening treatment step.

For the procedures of the steps, refer to known methods.

While the embodiment in which the undercoat layer 14 is used is described with reference to FIG. 1, the undercoat layer is not essential for the lithographic printing plate precursor as described above.

When the undercoat layer is not provided, the image recording layer may be formed after the aluminum support is subjected to hydrophilizing treatment.

Hydrophilizing treatment may be performed by the known method disclosed in paragraphs [0109] to [0114] of JP 2005-254638 A. In particular, it is preferable to perform hydrophilizing treatment by a method in which the aluminum plate is immersed in an aqueous solution of an alkali metal silicate such as sodium silicate or potassium silicate or is coated with a hydrophilic vinyl polymer or a hydrophilic compound to form a hydrophilic undercoat layer.

Hydrophilizing treatment with an aqueous solution of an alkali metal silicate such as sodium silicate or potassium silicate can be carried out according to the processes and procedures described in U.S. Pat. Nos. 2,714,066 and 3,181,461.

[Lithographic Printing Plate Manufacturing Method]

Next, the method of manufacturing a lithographic printing plate using the lithographic printing plate precursor is described.

A typical manufacturing method of a lithographic printing plate has an exposure step in which a lithographic printing plate precursor is imagewise exposed (i.e., is subjected to image exposure) to form exposed portions and unexposed portions and a step of removing the unexposed portions of the imagewise-exposed lithographic printing plate precursor.

More specifically, one embodiment of the lithographic printing plate manufacturing method is a method having an exposure step in which a lithographic printing plate precursor is imagewise exposed (i.e., is subjected to image exposure) to form exposed portions and unexposed portions and a removal step of removing the unexposed portions of the lithographic printing plate precursor with a developer at a pH of 2 to 12.

Another embodiment of the lithographic printing plate manufacturing method is a method having an exposure step in which a lithographic printing plate precursor is imagewise exposed (i.e., is subjected to image exposure) to form exposed portions and unexposed portions and an on-press development step of removing the unexposed portions of the imagewise-exposed lithographic printing plate precursor on a printing press by supplying at least one of printing ink and fountain solution.

These embodiments are described below.

The lithographic printing plate manufacturing method includes a step in which the lithographic printing plate precursor is imagewise exposed (i.e., is subjected to image exposure). The image exposure is carried out by exposure to a laser beam through a transparent original having, for example, a line image or a halftone dot image or by laser beam scanning using digital data.

The wavelength of a light source is preferably 750 to 1,400 nm. In the case of using a light source emitting light having a wavelength of 750 to 1,400 nm, an image recording layer containing an infrared absorber which is a sensitizing dye having an absorption in this wavelength range is preferably used.

Examples of the light source emitting light having a wavelength of 750 to 1,400 nm include a solid-state laser and semiconductor laser emitting infrared radiation. An infrared laser preferably has a power of 100 mW or more, an exposure time of up to 20 microseconds per pixel and an amount of irradiation energy of 10 to 300 $mJ/cm^2$. A multi-beam laser device is preferably used to shorten the exposure time. The exposure mechanism used may be of any of inner surface drum type, outer surface drum type and flat bed type.

The image exposure can be carried out using a platesetter or the like by an ordinary method. In the case of employing an on-press development technique to be described later, the image exposure of the lithographic printing plate precursor may be carried out on a printing press after the lithographic printing plate precursor is mounted on the printing press.

The lithographic printing plate precursor having undergone image exposure is developed by removing unexposed portions with a developer at a pH of 2 to 12 (developer treatment technique) or removing unexposed portions with at least one of printing ink and fountain solution on a printing press (on-press development technique).

(Developer Treatment Technique)

In the developer treatment technique, the lithographic printing plate precursor having undergone image exposure is treated with a developer at a pH of 2 to 14 to remove the image recording layer in unexposed portions, thereby manufacturing a lithographic printing plate.

For the developer, preferred is a developer at a pH of 5 to 10 containing at least one acid group selected from the group consisting of a phosphate group, a phosphonate group and a phosphinate group, and a compound having at least one carboxyl group (specific compound).

One exemplary method of development process is, in the case of manual treatment, a method involving fully impregnating the developer into a sponge or absorbent cotton, treating the lithographic printing plate precursor by rubbing the entire plate surface therewith, and after the completion of the treatment, thoroughly drying the precursor. In the case of immersion treatment, one exemplary method is a method involving immersing the lithographic printing plate precursor in the developer in a vat or a deep tank for about 60 seconds with stirring and then thoroughly drying the precursor while rubbing it with absorbent cotton, a sponge or the like.

In the development process, an apparatus having a simplified structure and enabling simplified steps is preferably used.

In a conventional development process, a protective layer is removed in a prior water rinsing step, development is subsequently carried out with an alkaline developer, thereafter alkali is removed in a posterior water rinsing step, gumming treatment is carried out in a gum coating step, and then drying is carried out in a drying step.

Development and gum coating can simultaneously be carried out with single liquid. For the gum, polymers are preferred, and water-soluble polymer compounds and surfactants are more preferred.

It is preferable that removal of a protection layer, development and gum coating be simultaneously carried out with single liquid without the prior water rinsing step. It is also preferable that, after development and gum coating, an excess developer be removed with squeeze rollers and then drying be carried out.

In this treatment, a method in which immersion into the above developer is carried out one time or two or more times may be used. In particular, a method in which immersion into the above developer is carried out one time or two times is preferred.

Immersion may be carried out by dipping the exposed lithographic printing plate precursor in the developer in a developer tank or spraying a surface of the exposed lithographic printing plate precursor with the developer using a spray or the like.

Even when immersion into the developer is carried out two or more times, if two or more immersion operations are performed with the same developer or with the developer and the developer used (exhausted developer) in which ingredients of the image recording layer are dissolved or dispersed through the development process, this is defined as the development process using a single liquid (single liquid treatment).

In the development process, a rubbing member is preferably used, and a development bath used for removing non-image portions of the image recording layer is preferably provided with the rubbing member such as a brush.

The development process may be carried out by an ordinary method, for instance, by immersing the exposed lithographic printing plate precursor in the developer at a temperature of preferably 0° C. to 60° C. and more preferably 15° C. to 40° C. and rubbing the precursor with a brush or by pumping up a treatment solution in an external tank and spraying the solution from a spray nozzle, followed by rubbing with a brush. These development processes may be carried out plural times consecutively. For example, the developer in an external tank is pumped up and sprayed from a spray nozzle, followed by rubbing with a brush; thereafter the developer may be again sprayed from the spray nozzle, followed by rubbing with the brush. When the development process is performed using an automatic development machine, the developer is fatigued with increased amount of treatment, and therefore, a replenisher or a fresh developer is preferably used to allow the treatment ability to recover.

For the development process in this disclosure, use may also be made of a gum coater and an automatic development machine that are conventionally known as the machines for treating PS plates (Presensitized Plates) or for use in the CTP (Computer-to-Plate) technology. In the case of using an automatic development machine, the machine is applicable to any of a method involving pumping up a developer in a development tank or an external tank and spraying the developer from a spray nozzle, a method involving immersing a printing plate into a developer filling a tank while traveling the immersed plate by means of in-liquid guide rolls or the like, and a method involving carrying out treatment by supplying a substantially unused developer only in an amount necessary for each plate, which is a so-called disposable treatment method. In any of the methods, it is preferable to have a rubbing mechanism using, for instance, a brush or a molleton. For example, commercially available automatic development machines (Clean Out Unit C85/C125, Clean Out Unit+ C85/120, FCF 85V, FCF 125V, FCF News (manufactured by Glunz & Jensen A/S); Azura CX 85, Azura CX 125, Azura CX 150 (manufactured by Agfa Graphics)) may be used. An apparatus having a laser exposure component and an automatic development machine component integrally incorporated therein may also be used.

(On-Press Development Technique)

In the on-press development technique, on a printing press, printing ink and fountain solution are supplied to the lithographic printing plate precursor having undergone image exposure to remove the image recording layer in non-image portions, thereby manufacturing a lithographic printing plate.

Specifically, the lithographic printing plate precursor is, after image exposure, directly mounted on a printing press without undergoing any type of developer treatment or is mounted on a printing press and subsequently subjected to image exposure on the printing press; the precursor is then supplied with printing ink and fountain solution for printing. As a result, in the early stage of printing, in non-image portions, the image recording layer in unexposed portions is dissolved or dispersed by the supplied printing ink and/or fountain solution and thus removed, so that a hydrophilic surface is exposed in those portions. On the other hand, in exposed portions, the image recording layer is cured by exposure to light to form oil-based ink receptive portions having a lipophilic surface. While either the printing ink or the fountain solution may be first supplied onto the plate surface, it is preferred to first supply the printing ink for the purpose of preventing the fountain solution from being contaminated with the removed ingredients of the image recording layer.

Thus, the lithographic printing plate precursor is subjected to on-press development on a printing press and directly used to print a large number of impressions. In other words, one embodiment of the printing method of the invention is a method having an exposure step of imagewise exposing a lithographic printing plate precursor to form exposed portions and unexposed portions and a printing step of performing printing by supplying at least one of printing ink and fountain solution to remove the unexposed portions of the imagewise-exposed lithographic printing plate precursor on a printing press.

In the method of manufacturing a lithographic printing plate from the lithographic printing plate precursor according to the invention, the entire surface of the lithographic printing plate precursor may optionally be heated before image exposure, during image exposure or in the period from image exposure to development process, regardless of the type of development technique.

EXAMPLES

The present invention is described below in further detail by way of examples. The materials, amounts of use, ratios, treatments and treatment procedures illustrated in the examples below may be modified as appropriate as long as they do not depart from the scope and spirit of the present invention. Therefore, the scope of the present invention should not be construed as being limited to the following examples.

[Manufacture of Aluminum Support]

Aluminum plates (aluminum alloy plates) of material type 1S with a thickness of 0.3 mm were subjected to one of the treatments (A) to (D) described below to manufacture aluminum supports. Rinsing treatment was performed between every two treatment steps, and the water remaining after rinsing treatment was removed with nip rollers.

Example 1

<Treatment A>

(A-a) Alkali Etching Treatment

Etching treatment was performed by using a spray line to spray the aluminum plate with an aqueous solution having a sodium hydroxide concentration of 26 wt %, an aluminum ion concentration of 6.5 wt %, and a temperature of 70° C. The aluminum plate was then rinsed by spraying with water. The amount of aluminum dissolved from the surface to be subjected to electrochemical graining treatment was 10 $g/m^2$.

(A-b) Desmutting Treatment in Aqueous Acid Solution (First Desmutting Treatment)

Next, desmutting treatment was performed in an aqueous acid solution. The aqueous acid solution used in desmutting treatment contained 150 g/L of sulfuric acid. The solution temperature was 30° C. Desmutting treatment was performed by spraying the aluminum plate with the desmutting solution for 3 seconds. Then, rinsing treatment was carried out.

(A-c) Electrochemical Graining Treatment in Aqueous Hydrochloric Acid Solution (Hydrochloric Acid Electrolytic Treatment)

Next, electrolytic graining treatment was carried out using an alternating current in an electrolytic solution having a hydrochloric acid concentration of 13 g/L, an aluminum ion concentration of 15 g/L and a sulfuric acid concentration of 2 g/L. The electrolytic solution had a temperature of 30'C. Aluminum chloride was added to adjust the aluminum ion concentration.

The alternating current had a sinusoidal waveform whose positive and negative sides were symmetric; the frequency was 60 Hz; the ratio of the anodic reaction time to the cathodic reaction time in one cycle of alternating current was 1:1; and the current density at the current peak in the AC waveform was 75 A/dm$^2$. The total amount of electricity furnished for the anodic reaction on the aluminum plate was 450 C/dm$^2$, and the aluminum plate was electrolyzed four times by separately applying 112.5 C/dm$^2$ of electricity at intervals of 4 seconds. A carbon electrode was used as the counter electrode of the aluminum plate. Then, rinsing treatment was carried out.

(A-d) Alkali Etching Treatment

Etching treatment was performed by using a spray line to spray the aluminum plate having undergone electrochemical graining treatment with an aqueous solution having a sodium hydroxide concentration of 5 wt %, an aluminum ion concentration of 0.5 wt %, and a temperature of 25° C. The amount of aluminum dissolved from the surface having undergone electrochemical graining treatment was 0.2 g/m$^2$. Then, rinsing treatment was carried out.

(A-e) Desmutting Treatment in Aqueous Acid Solution

Next, desmutting treatment was performed in an aqueous acid solution. The aqueous acid solution used in desmutting treatment was wastewater generated in an anodizing treatment step (aqueous solution containing 170 g/L of sulfuric acid and 5.0 g/L of aluminum ions dissolved therein). The solution temperature was 30° C. Desmutting treatment was performed by spraying the aluminum plate with the desmutting solution for 3 seconds.

(A-f) Anodizing Treatment

Figure 6:
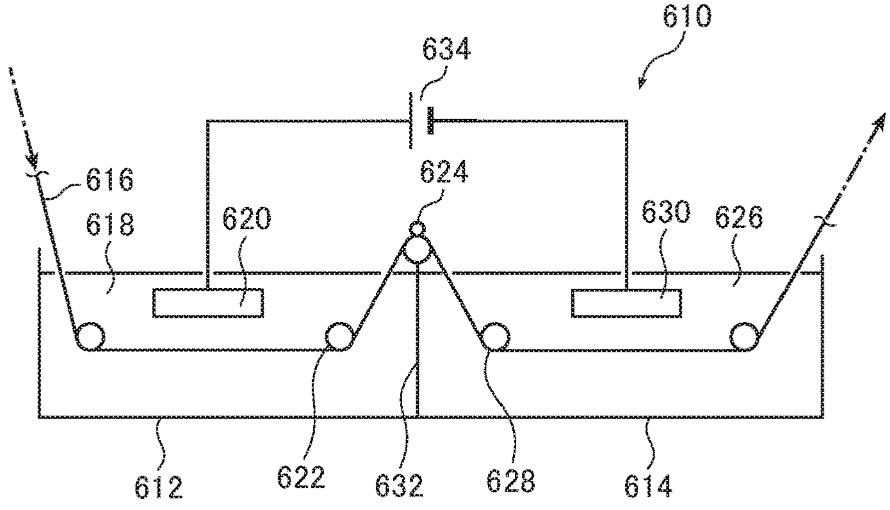
FIG. 6 is a schematic view of an anodizing apparatus that may be used in anodizing treatment during manufacture of the aluminum support.

First anodizing treatment was performed by DC electrolysis using an anodizing apparatus of the structure shown in FIG. 6. Anodizing treatment was performed under the conditions shown in Table 1 to form an anodized film with a specified film thickness, thereby manufacturing an aluminum support.

Examples 2 to 16, 23, 24, 26 and 27

Example 1 was repeated except that the sulfuric acid concentration of the aqueous hydrochloric acid solution and the frequency in (A-c) hydrochloric acid electrolytic treatment, the conditions and the presence/absence of (A-d) alkali etching treatment, and the electrolytic solution, the temperature, the current density and the film weight in (A-f) anodizing treatment were changed to those shown in Table 1 below, thereby manufacturing an aluminum support. In Table 1 below, Examples 1, 23 and 24 are examples with undercoat layers of different types, and for the aluminum support, there is no difference; and Examples 26 and 27 are examples with image recording layers of different types, and for the aluminum support, there is no difference.

Examples 17 to 20

<Treatment B>

(B-a) Alkali Etching Treatment

Etching treatment was performed by using a spray line to spray the aluminum plate with an aqueous solution having a sodium hydroxide concentration of 26 wt %, an aluminum ion concentration of 6.5 wt %, and a temperature of 70° C. The aluminum plate was then rinsed by spraying with water. The amount of aluminum dissolved from the surface to be subjected to electrochemical graining treatment was 10 g/m$^2$.

(B-b) Desmutting Treatment in Aqueous Acid Solution (First Desmutting Treatment)

Next, desmutting treatment was performed in an aqueous acid solution. The aqueous acid solution used in desmutting treatment contained 150 g/L of sulfuric acid. The solution temperature was 30° C. Desmutting treatment was performed by spraying the aluminum plate with the desmutting solution for 3 seconds. Then, rinsing treatment was carried out.

(B-c) Electrochemical Graining Treatment in Aqueous Hydrochloric Acid Solution

Next, electrolytic graining treatment was carried out using an alternating current in an electrolytic solution having a hydrochloric acid concentration of 13 g/L, an aluminum ion concentration of 15 g/L and a sulfuric acid concentration of 3 g/L. The electrolytic solution had a temperature of 30° C. Aluminum chloride was added to adjust the aluminum ion concentration. The alternating current had a sinusoidal waveform whose positive and negative sides were symmetric; the frequency was 60 Hz; the ratio of the anodic reaction time to the cathodic reaction time in one cycle of alternating current was 1:1; and the current density at the current peak in the AC waveform was 75 A/dm$^2$. The total amount of electricity furnished for the anodic reaction on the aluminum plate was 450 C/dm$^2$, and the aluminum plate was electrolyzed four times by separately applying 112.5 C/dm$^2$ of electricity at intervals of 4 seconds. A carbon electrode was used as the counter electrode of the aluminum plate. Then, rinsing treatment was carried out.

(B-d) Alkali Etching Treatment

Etching treatment was performed by using a spray line to spray the aluminum plate having undergone electrochemical graining treatment with an aqueous solution having a sodium hydroxide concentration of 5 wt %, an aluminum ion concentration of 0.5 wt %, and a temperature of 25° C. The amount of aluminum dissolved from the surface having undergone electrochemical graining treatment was 0.2 g/m$^2$. Then, rinsing treatment was carried out.

(B-e) Desmutting Treatment in Aqueous Acid Solution

Next, desmutting treatment was performed in an aqueous acid solution. The aqueous acid solution used in desmutting treatment was wastewater generated in an anodizing treatment step (aqueous solution containing 170 g/L of sulfuric acid and 5.0 g/L of aluminum ions dissolved therein). The solution temperature was 30° C. Desmutting treatment was performed by spraying the aluminum plate with the desmutting solution for 3 seconds.

(B-f) Anodizing Treatment

First anodizing treatment was performed by DC electrolysis using an anodizing apparatus of the structure shown in FIG. 6. Anodizing treatment was performed under the conditions shown in Table 1 to form an anodized film with a specified film thickness.

(B-g) Pore-Widening Treatment

Pore-widening treatment was performed by immersing the anodized aluminum plate in an aqueous solution having a sodium hydroxide concentration of 5 wt % and an aluminum ion concentration of 0.5 wt % under the conditions shown in Table 1. The aluminum plate was then rinsed by spraying with water to thereby manufacture an aluminum support.

Examples 21 to 22, 25, 29 and 31

<Treatment C>

(C-a) Alkali Etching Treatment

Etching treatment was performed by using a spray line to spray the aluminum plate with an aqueous solution having a sodium hydroxide concentration of 26 wt %, an aluminum ion concentration of 6.5 wt %, and a temperature of 70° C. The aluminum plate was then rinsed by spraying with water. The amount of aluminum dissolved from the surface to be subjected to electrochemical graining treatment was 10 $g/m^2$.

(C-b) Desmutting Treatment in Aqueous Acid Solution (First Desmutting Treatment)

Next, desmutting treatment was performed in an aqueous acid solution. The aqueous acid solution used in desmutting treatment contained 150 g/L of sulfuric acid. The solution temperature was 30° C. Desmutting treatment was performed by spraying the aluminum plate with the desmutting solution for 3 seconds. Then, rinsing treatment was carried out.

(C-c) Electrochemical Graining Treatment in Aqueous Hydrochloric Acid Solution

Next, electrolytic graining treatment was carried out using an alternating current in an electrolytic solution having a hydrochloric acid concentration of 13 g/L, an aluminum ion concentration of 15 g/L and a sulfuric acid concentration of 3 g/L. The electrolytic solution had a temperature of 30'C. Aluminum chloride was added to adjust the aluminum ion concentration. The alternating current had a sinusoidal waveform whose positive and negative sides were symmetric; the frequency was 60 Hz; the ratio of the anodic reaction time to the cathodic reaction time in one cycle of alternating current was 1:1; and the current density at the current peak in the AC waveform was 75 $A/dm^2$. The total amount of electricity furnished for the anodic reaction on the aluminum plate was 450 $C/dm^2$, and the aluminum plate was electrolyzed four times by separately applying 112.5 $C/dm^2$ of electricity at intervals of 4 seconds. A carbon electrode was used as the counter electrode of the aluminum plate. Then, rinsing treatment was carried out.

(C-d) Alkali Etching Treatment

Etching treatment was performed by using a spray line to spray the aluminum plate having undergone electrochemical graining treatment with an aqueous solution having a sodium hydroxide concentration of 5 wt %, an aluminum ion concentration of 0.5 wt %, and a temperature of 25° C. The amount of aluminum dissolved from the surface having undergone electrochemical graining treatment was 0.2 $g/m^2$. Then, rinsing treatment was carried out.

(C-e) Desmutting Treatment in Aqueous Acid Solution

Next, desmutting treatment was performed in an aqueous acid solution. The aqueous acid solution used in desmutting treatment was wastewater generated in an anodizing treatment step (aqueous solution containing 170 g/L of sulfuric acid and 5.0 g/L of aluminum ions dissolved therein). The solution temperature was 30° C. Desmutting treatment was performed by spraying the aluminum plate with the desmutting solution for 3 seconds.

(C-f) First Anodizing Treatment

First anodizing treatment was performed by DC electrolysis using an anodizing apparatus of the structure shown in FIG. 6. Anodizing treatment was performed under the conditions shown in Table 1 to form an anodized film with a specified film thickness.

(C-g) Pore-Widening Treatment

Pore-widening treatment was performed by immersing the anodized aluminum plate in an aqueous solution having a sodium hydroxide concentration of 5 wt % and an aluminum ion concentration of 0.5 wt % under the conditions shown in Table 1. The aluminum plate was then rinsed by spraying with water.

(C-h) Second Anodizing Treatment

Second anodizing treatment was performed by DC electrolysis using an anodizing apparatus of the structure shown in FIG. 6. Anodizing treatment was performed under the conditions shown in Table 1 to form an anodized film with a specified film thickness, thereby manufacturing an aluminum support.

Examples 28, 30 and 32

<Treatment D>

(D-a) Alkali Etching Treatment

Etching treatment was performed by using a spray line to spray the aluminum plate with an aqueous solution having a sodium hydroxide concentration of 26 wt %, an aluminum ion concentration of 6.5 wt %, and a temperature of 70° C. The aluminum plate was then rinsed by spraying with water. The amount of aluminum dissolved from the surface to be subjected to electrochemical graining treatment was 10 $g/m^2$.

(D-b) Desmutting Treatment in Aqueous Acid Solution (First Desmutting Treatment)

Next, desmutting treatment was performed in an aqueous acid solution. The aqueous acid solution used in desmutting treatment contained 150 g/L of sulfuric acid. The solution temperature was 30° C. Desmutting treatment was performed by spraying the aluminum plate with the desmutting solution for 3 seconds. Then, rinsing treatment was carried out.

(D-c) Electrochemical Graining Treatment in Aqueous Hydrochloric Acid Solution

Next, electrolytic graining treatment was carried out using an alternating current in an electrolytic solution having a hydrochloric acid concentration of 13 g/L, an aluminum ion concentration of 15 g/L and a sulfuric acid concentration of 0.6 g/L. The electrolytic solution had a temperature of 30'C. Aluminum chloride was added to adjust the aluminum ion concentration. The alternating current had a sinusoidal waveform whose positive and negative sides were symmetric; the frequency was 60 Hz; the ratio of the anodic reaction time to the cathodic reaction time in one cycle of alternating current was 1:1; and the current density at the current peak in the AC waveform was 75 $A/dm^2$. The total amount of electricity furnished for the anodic reaction on the aluminum plate was 450 $C/dm^2$, and the aluminum plate was electrolyzed four times by separately applying 112.5 $C/dm^2$ of electricity at intervals of 4 seconds. A carbon electrode was used as the counter electrode of the aluminum plate. Then, rinsing treatment was carried out.

(D-d) Alkali Etching Treatment

Etching treatment was performed by using a spray line to spray the aluminum plate having undergone electrochemical graining treatment with an aqueous solution having a sodium hydroxide concentration of 5 wt %, an aluminum ion concentration of 0.5 wt %, and a temperature of 25° C. The amount of aluminum dissolved from the surface having undergone electrochemical graining treatment was as shown in Table 1. Then, rinsing treatment was carried out.

(D-e) Desmutting Treatment in Aqueous Acid Solution

Next, desmutting treatment was performed in an aqueous acid solution. The aqueous acid solution used in desmutting treatment was wastewater generated in an anodizing treatment step (aqueous solution containing 170 g/L of sulfuric acid and 5.0 g/L of aluminum ions dissolved therein). The solution temperature was 30° C. Desmutting treatment was performed by spraying the aluminum plate with the desmutting solution for 3 seconds.

(D-f) First Anodizing Treatment

First anodizing treatment was performed by DC electrolysis using an anodizing apparatus of the structure shown in FIG. 6. Anodizing treatment was performed under the conditions shown in Table 1 to form an anodized film with a specified film thickness.

(D-g) Second Anodizing Treatment

Second anodizing treatment was performed by DC electrolysis using an anodizing apparatus of the structure shown in FIG. 6. Anodizing treatment was performed under the conditions shown in Table 1 to form an anodized film with a specified film thickness, thereby manufacturing an aluminum support.

Comparative Examples 1 to 3

Example 1 was repeated except that the sulfuric acid concentration of the aqueous hydrochloric acid solution in (A-c) hydrochloric acid electrolytic treatment and the conditions of (A-d) alkali etching treatment were changed to those shown in Table 1 below, thereby manufacturing an aluminum support.

Comparative Example 4

An aluminum support was manufactured according to the procedure described in paragraphs [0158] to [0166] of Patent Literature 1 (JP 2005-262530 A).

TABLE 1

| | Hydrochloric acid electrolytic treatment | | | | | | | | | First anodizing treatment |
|---|---|---|---|---|---|---|---|---|---|---|
| | Alkali etching ($g/m^2$) | Hydrochloric acid concentration (g/l) | Sulfuric acid concentration (g/l) | Aluminum concentration (g/l) | Solution temp. (° C.) | Waveform | Frequency (Hz) | Amount of electricity ($C/dm^2$) | Alkali etching ($g/m^2$) | Electrolytic solution (g/l) |
| EX 1 | 10 | 13 | 2 | 15 | 30 | Sinusoidal | 60 | 450 | 0.2 | Sulfuric acid 170 |
| EX 2 | 10 | 13 | 1.5 | 15 | 30 | Sinusoidal | 60 | 450 | 0.2 | Sulfuric acid 170 |
| EX 3 | 10 | 13 | 0.6 | 15 | 30 | Sinusoidal | 60 | 450 | 0.2 | Sulfuric acid 170 |
| EX 4 | 10 | 13 | 0.2 | 15 | 30 | Sinusoidal | 60 | 450 | 0.2 | Sulfuric acid 170 |
| EX 5 | 10 | 13 | 0.6 | 15 | 30 | Sinusoidal | 60 | 450 | 0.4 | Sulfuric acid 170 |
| EX 6 | 10 | 13 | 0.6 | 15 | 30 | Sinusoidal | 60 | 450 | 0.3 | Sulfuric acid 170 |
| EX 7 | 10 | 13 | 0.6 | 15 | 30 | Sinusoidal | 60 | 450 | 0.1 | Sulfuric acid 170 |
| EX 8 | 10 | 13 | 0.6 | 15 | 30 | Sinusoidal | 60 | 450 | 0 | Sulfuric acid 170 |
| EX 9 | 10 | 13 | 0.6 | 15 | 30 | Sinusoidal | 300 | 450 | 0.2 | Sulfuric acid 170 |
| EX 10 | 10 | 13 | 0.6 | 15 | 30 | Sinusoidal | 200 | 450 | 0.2 | Sulfuric acid 170 |
| EX 11 | 10 | 13 | 0.6 | 15 | 30 | Sinusoidal | 120 | 450 | 0.2 | Sulfuric acid 170 |
| EX 12 | 10 | 13 | 0.6 | 15 | 30 | Sinusoidal | 30 | 450 | 0.2 | Sulfuric acid 170 |
| EX 13 | 10 | 13 | 0.6 | 15 | 30 | Sinusoidal | 10 | 450 | 0.2 | Sulfuric acid 170 |
| EX 14 | 10 | 13 | 0.6 | 15 | 30 | Sinusoidal | 60 | 450 | 0.2 | Sulfuric acid 170 |
| EX 15 | 10 | 13 | 0.6 | 15 | 30 | Sinusoidal | 60 | 450 | 0.2 | Sulfuric acid 170 |
| EX 16 | 10 | 13 | 0.6 | 15 | 30 | Sinusoidal | 60 | 450 | 0.3 | Sulfuric acid 170 |
| EX 17 | 10 | 13 | 0.6 | 15 | 30 | Sinusoidal | 60 | 450 | 0.2 | Sulfuric acid 170 |
| EX 18 | 10 | 13 | 0.6 | 15 | 30 | Sinusoidal | 60 | 450 | 0.2 | Sulfuric acid 170 |
| EX 19 | 10 | 13 | 0.6 | 15 | 30 | Sinusoidal | 60 | 450 | 0.2 | Sulfuric acid 170 |
| EX 20 | 10 | 13 | 0.6 | 15 | 30 | Sinusoidal | 60 | 450 | 0.2 | Sulfuric acid 170 |
| EX 21 | 10 | 13 | 0.6 | 15 | 30 | Sinusoidal | 60 | 450 | 0.2 | Sulfuric acid 170 |
| EX 22 | 10 | 13 | 0.6 | 15 | 30 | Sinusoidal | 60 | 450 | 0.2 | Sulfuric acid 170 |
| EX 23 | 10 | 13 | 0.6 | 15 | 30 | Sinusoidal | 60 | 450 | 0.2 | Sulfuric acid 170 |
| EX 24 | 10 | 13 | 0.6 | 15 | 30 | Sinusoidal | 60 | 450 | 0.2 | Sulfuric acid 170 |

TABLE 1-continued

| | | | | | | | | | | |
|---|---|---|---|---|---|---|---|---|---|---|
| EX 25 | 10 | 13 | 0.6 | 15 | 30 | Sinusoidal | 60 | 450 | 0.2 | Sulfuric acid 170 |
| EX 26 | 10 | 13 | 0.6 | 15 | 30 | Sinusoidal | 60 | 450 | 0.2 | Phosphoric acid 150 |
| EX 27 | 10 | 13 | 0.6 | 15 | 30 | Sinusoidal | 60 | 450 | 0.05 | Phosphoric acid 150 |
| EX 28 | 10 | 13 | 0.6 | 15 | 30 | Sinusoidal | 60 | 450 | 0.05 | Phosphoric acid 150 |
| EX 29 | 10 | 13 | 0.6 | 15 | 30 | Sinusoidal | 60 | 450 | 0.05 | Phosphoric acid 150 |
| EX 30 | 10 | 13 | 0.6 | IS | 30 | Sinusoidal | 60 | 450 | 0.05 | Phosphoric acid 150 |
| EX 31 | 10 | 13 | 0.6 | 15 | 30 | Sinusoidal | 60 | 450 | 0.05 | Phosphoric acid 150 |
| EX 32 | 10 | 13 | 0.6 | 15 | 30 | Sinusoidal | 60 | 360 | 0.2 | Phosphoric acid 150 |
| CE 1 | 10 | 13 | 0 | 15 | 30 | Sinusoidal | 60 | 450 | 0.2 | 170 |
| CE 2 | 10 | 13 | 4.5 | 15 | 30 | Sinusoidal | 60 | 450 | 0.2 | 170 |
| CE 3 | 10 | 13 | 6 | 15 | 30 | Sinusoidal | 60 | 450 | 0.2 | 170 |
| CE 4 | JP 2005-262530 A. Example 1 (Transfer large-wave + Hydrochloric acid electrolysis graining) | | | | | | | | | |

| | First anodizing treatment | | | Pore-widening treatment | | Second anodizing treatment | | | |
|---|---|---|---|---|---|---|---|---|---|
| | Temp. (° C.) | Current density (A/dm²) | Coating weight (g/m²) | Temp. (° C.) | Time (sec) | Sulfuric acid concentration of electrolytic solution (g/l) | Temp. (° C.) | Current density (A/dm²) | Coating weight (g/m²) |
| EX 1 | 50 | 20 | 2.4 | — | — | — | — | — | — |
| EX 2 | 50 | 20 | 2.4 | — | — | — | — | — | — |
| EX 3 | 50 | 20 | 2.4 | — | — | — | — | — | — |
| EX 4 | 50 | 20 | 2.4 | — | — | — | — | — | — |
| EX 5 | 50 | 20 | 2.4 | — | — | — | — | — | — |
| EX 6 | 50 | 20 | 2.4 | — | — | — | — | — | — |
| EX 7 | 50 | 20 | 2.4 | — | — | — | — | — | — |
| EX 8 | 50 | 20 | 2.4 | — | — | — | — | — | — |
| EX 9 | 50 | 20 | 2.4 | — | — | — | — | — | — |
| EX 10 | 50 | 20 | 2.4 | — | — | — | — | — | — |
| EX 11 | 50 | 20 | 2.4 | — | — | — | — | — | — |
| EX 12 | 50 | 20 | 2.4 | — | — | — | — | — | — |
| EX 13 | 50 | 20 | 2.4 | — | — | — | — | — | — |
| EX 14 | 50 | 20 | 3.5 | — | — | — | — | — | — |
| EX 15 | 50 | 20 | 5.0 | — | — | — | — | — | — |
| EX 16 | 50 | 20 | 7.0 | — | — | — | — | — | — |
| EX 17 | 50 | 30 | 2.4 | 20 | 3 | — | — | — | — |
| EX 18 | 50 | 30 | 2.4 | 25 | 3 | — | — | — | — |
| EX 19 | 50 | 30 | 2.4 | 38 | 3 | — | — | — | — |
| EX 20 | 50 | 30 | 2.4 | 43 | 3 | — | — | — | — |
| EX 21 | 50 | 30 | 0.3 | 30 | 3 | Sulfuric acid 170 | 50 | 20 | 2.1 |
| EX 22 | 50 | 30 | 0.3 | 40 | 3 | Sulfuric acid 170 | 50 | 20 | 2.1 |
| EX 23 | 50 | 20 | 2.4 | — | — | — | — | — | — |
| EX 24 | 50 | 20 | 2.4 | — | — | — | — | — | — |
| EX 25 | 50 | 20 | 1.8 | 25 | 2.4 | Sulfuric acid 170 | 50 | 20 | 0.6 |
| EX 26 | 35 | 5 | 1.5 | — | — | — | — | — | — |
| EX 27 | 35 | 5 | 1.5 | — | — | — | — | — | — |
| EX 28 | 35 | 5 | 1.0 | — | — | Sulfuric acid 170 | 50 | 20 | 2.1 |
| EX 29 | 35 | 5 | 1.0 | 40 | 3 | Sulfuric acid 170 | 50 | 20 | 2.1 |
| EX 30 | 35 | 5 | 1.0 | — | — | Phosphoric acid 150 | 35 | 5 | 1.2 |
| EX 31 | 35 | 5 | 1.0 | 40 | 3 | Phosphoric acid 150 | 35 | 5 | 2.1 |
| EX 32 | 35 | 5 | 1.0 | — | — | Sulfuric acid 170 | 50 | 2.0 | 2.1 |
| CE 1 | 50 | 20 | 2.4 | — | — | — | — | — | — |
| CE 2 | 50 | 20 | 2.4 | — | — | — | — | — | — |
| CE 3 | 50 | 20 | 2.4 | — | — | — | — | — | — |
| CE 4 | JP 2005-262530 A. Example 1 (Transfer large-wave + Hydrochloric acid electrolysis graining) | | | | | | | | |

EX: Example

CE: Comparative example

Of the manufactured aluminum supports, the density of the specific pits at the surface of the anodized film on the side opposite from the aluminum plate, the surface area ratio ΔS, the average aperture size (average diameter) of the small-wave pits, and the lightness L* in the L*a*b* color system were measured in the relevant manners described above. The results are shown in Table 2 below.

In addition, of the manufactured aluminum supports, the average diameter of the large-diameter portions in the anodized film having the micropores at the surface of the anodized film (average surface layer diameter), the average diameter of the small-diameter portions at their communication positions (average inner diameter), and the depths of the large-diameter portions and the small-diameter portions were measured in the relevant manners described above. The results are shown in Table 2 below. In Table 2 below, examples with the average surface layer diameter and the average inner diameter being the same are those in which no second anodizing treatment was performed.

[Formation of Undercoat Layer]

The surface of the anodized film of each aluminum support manufactured was subjected to one of treatments A to C, which are described below in detail. The type of the treatment employed in each of Examples and Comparative Examples is as shown in Table 2 below. In Example 27, no undercoat layer was formed and thus, "-" is given.

[Treatment A]

An undercoat layer-forming coating liquid 1 was applied onto the aluminum support to a dry coating weight of 20 $mg/m^2$ to thereby form an undercoat layer.

The undercoat layer-forming coating liquid 1 contained 0.5 g of polymer represented by the structural formula below, 0.86 g of 1 wt % aqueous solution of a surfactant (EMALEX 710) manufactured by Nihon Emulsion Co., Ltd. and 500 g of water. The value at the lower right of brackets of each constitutional unit is of weight percent.

[Chemical Fomula 9]

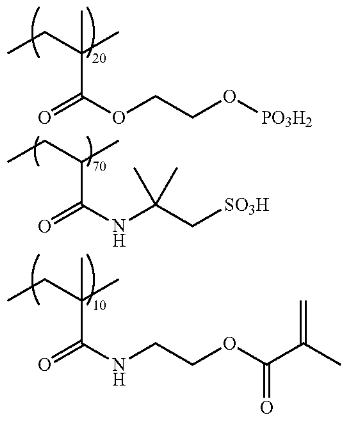

[Treatment B]

The aluminum support was immersed in an aqueous solution containing 4 g/L of polyvinylphosphonic acid (pH=1.9) at 40° C. for 10 seconds. Thereafter, the aluminum support was taken out, rinsed with demineralized water containing calcium ions at 20° C. for 2 seconds and dried. After this process, the amount of P and the amount of Ca on the aluminum support were 25 $mg/m^2$ and 1.9 $mg/m^2$, respectively.

[Treatment C]

An undercoat layer-forming coating liquid 2 was applied onto the aluminum support to a dry coating weight of 20 $mg/m^2$ to thereby form an undercoat layer.

The undercoat layer-forming coating liquid 2 contained 0.5 g of polymer represented by the structural formula below, 0.86 g of 1 wt % aqueous solution of a surfactant (EMALEX 710) manufactured by Nihon Emulsion Co., Ltd. and 500 g of water. The value at the lower right of brackets of each constitutional unit is of weight percent.

[Chemical Fomula 15]

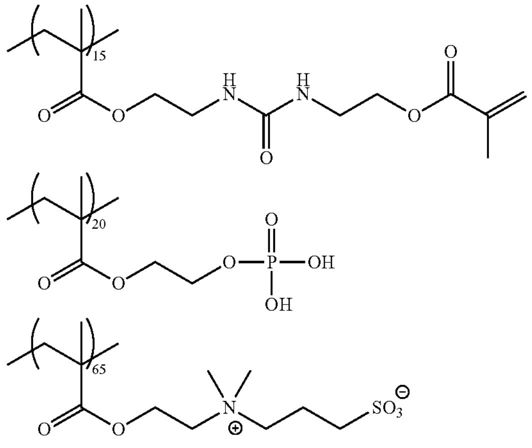

Mw 150,000

[Formation of Image Recording Layer]

One of image recording layers A to C, which are described below in detail, was formed on the aluminum support having the undercoat layer formed thereon. The formation methods of the image recording layers are as described below, and the type of the image recording layer employed in each of Examples and Comparative Examples is as shown in Table 2 below.

[Formation Method of Image Recording Layer A]

An image recording layer-forming coating liquid A of the composition shown below was applied on the aluminum support by bar coating and dried in an oven at 100° C. for 60 seconds to thereby form an image recording layer having a dry coating weight of 1.0 $g/m^2$.

The image recording layer-forming coating liquid A was obtained by mixing with stirring the photosensitive solution (1) and the microgel solution (1) described below just before use in application.

<Photosensitive Solution>

Binder polymer (1) [shown below] 0.240 g

Polymerization initiator (2) [shown below] 0.245 g

Infrared absorber (2) [shown below] 0.046 g borate compound 0.010 g

Sodium Tetraphenylborate

Radical polymerizable compound

Tris(acryloyloxyethyl)isocyanurate (NK ester A-9300, manufactured by Shin-Nakamura Chemical Corporation) 0.192 g Low-molecular-weight hydrophilic compound 0.062 g Tris(2-hydroxyethyl)isocyanurate Low-molecular-weight hydrophilic compound (1) [shown below]0.050 g Ink receptivity enhancer 0.055 g Phosphonium compound (1) [shown below]

Ink receptivity enhancer 0.018 g

Benzyl-dimethyl-octyl ammonium.PF6 salt

Ink receptivity enhancer 0.035 g

Ammonium group-bearing polymer (1)

[shown below; reduced specific viscosity, 44 ml/g]

Fluorosurfactant (1) [shown below] 0.008 g

2-Butanone 1.091 g

1-Methoxy-2-propanol 8.609 g

<Microgel Solution>

Microgel (1) 2.640 g

Distilled water 2.425 g

The binder polymer (1), the polymerization initiator (2), the infrared absorber (2), the low-molecular-weight hydrophilic compound (1), the phosphonium compound (1), the ammonium group-bearing polymer (1) and the fluorosurfactant (1) used in the photosensitive solution have the structures represented by the following formulae.

[Chemical Formula 11]

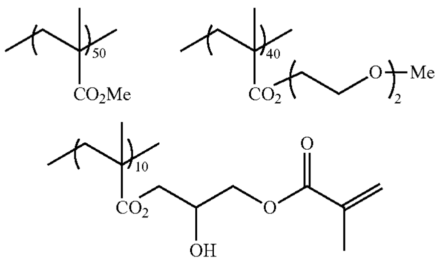

Binder polymer (1)

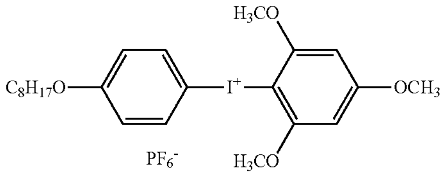

Polymerization initiator (2)

[Chemical Formula 12]

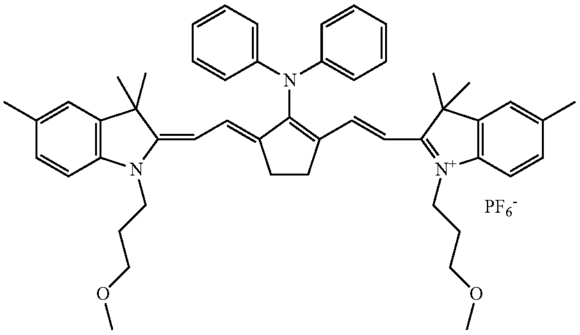

Infrared absorber (2)

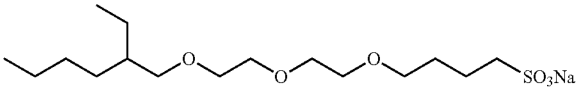

Low-molecular-weight hydrophilic compound (1)

-continued

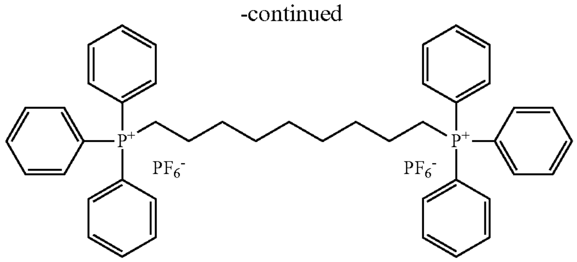

Phosphonium compound (1)

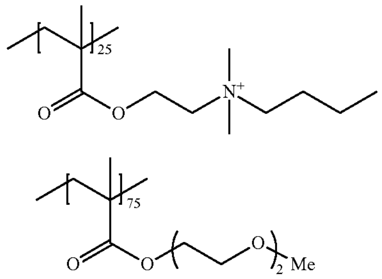

Ammonium group-bearing polymer (1)

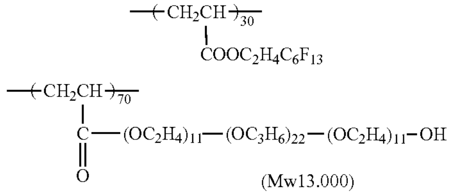

(Mw13.000)

Fluorosurfactant (1)

—Synthesis of Microgel (1)—

An oil phase component was obtained by dissolving 4.46 g of polyfunctional isocyanate having the structure below (manufactured by Mitsui Chemicals, Inc.; 75 wt % ethyl acetate solution), 10 g of an adduct obtained by adding trimethylolpropane (6 mol) and xylene diisocyanate (18 mol) and adding thereto polyoxyethylene terminated by methyl at one end (1 mol; the number of oxyethylene repeating units: 90) (manufactured by Mitsui Chemicals, Inc.; 50 wt % ethyl acetate solution), 3.15 g of pentaerythritol triacrylate (SR444, manufactured by Nippon Kayaku Co., Ltd.) and 0.1 g of Pionin A-41C (manufactured by Takemoto Oil & Fat Co., Ltd.) in 17 g of ethyl acetate. An aqueous phase component was obtained by preparing 40 g of 4 wt % aqueous solution of polyvinyl alcohol (PVA-205, manufactured by Kuraray Co., Ltd.).

The oil phase component and the aqueous phase component were mixed and emulsified in a homogenizer at 12,000 rpm for 10 minutes. The resulting emulsion was added to 25 g of distilled water, and the obtained solution was stirred at room temperature for 30 minutes and then at 50° C. for 3 hours. The thus obtained microgel was diluted with distilled water to have a solids concentration of 15 wt % and used as the microgel (1). The average particle size of the microgel (1) measured by a light scattering method was 0.2 μm.

[Chemical Formula 13]

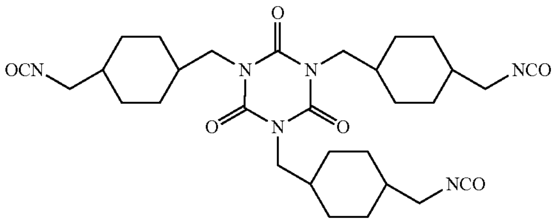

Polyfunctional isocyanate

[Formation Method of Image Recording Layer B]

An image recording layer-forming coating liquid B of the composition shown below was applied on the aluminum support and dried at 50° C. for 60 seconds to thereby form an image recording layer having a dry coating weight of 1.0 g/$m^2$.

The image recording layer-forming coating liquid B contained thermoplastic resin particles, an infrared absorber IR-01, polyacrylic acid and a surfactant, and had a pH of 3.6. Thermoplastic resin particles: Styrene/acrylonitrile copolymer (molar ratio 50/50); average particle size, 61 nm Infrared absorber IR-01: Infrared absorber having the structure below (Et represents an ethyl group)

[Chemical Formula 14]

IR-01

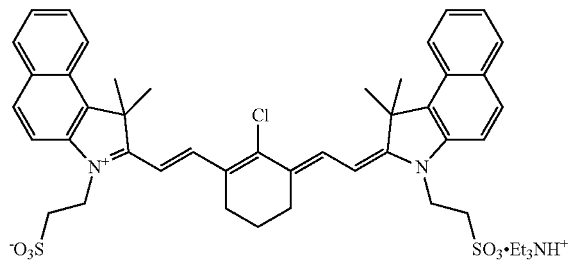

Polyacrylic acid: Weight-average molecular weight of 250,000

Surfactant: Zonyl FSO 100 (manufactured by E. I. du Pont de Nemours and Company)

The foregoing components are applied in amounts as stated below.

Thermoplastic resin particles: 0.69 (g/$m^2$)

Infrared absorber IR-01: $1.03\times10^{-4}$ (mol/$m^2$)

Polyacrylic acid: 0.09 (g/$m^2$)

Surfactant: 0.0075 (g/$m^2$)

[Formation Method of Image Recording Layer C]

An image recording layer-forming coating liquid C of the composition shown below was applied on the aluminum support by bar coating and dried in an oven at 100° C. for 60 seconds to thereby form an image recording layer having a dry coating weight of 1.0 g/$m^2$.

<Image Recording Layer-Forming Coating Liquid C>

Polymerizable compound 1: 0.15 parts by weight

Polymerizable compound 2: 0.1 parts by weight

Graft copolymer 2: 0.825 parts by weight

Klucel M (manufactured by Hercules Incorporated): 0.020 parts by weight

Irgacure 250 (manufactured by BASF): 0.032 parts by weight

Infrared absorber (1): 0.02 parts by weight

Sodium tetraphenylborate: 0.03 parts by weight

BYK 336 (manufactured by BYK-Chemie): 0.015 parts by weight

Black-XV (Yamamoto Chemicals, Inc.): 0.04 parts by weight n-Propanol: 7.470 parts by weight Water: 1.868 parts by weight Polymerizable compound 1: UA510H (manufactured by Kyoeisha Chemical Co., Ltd.; reaction product of dipentaerythritol pentaacrylate and hexamethylene diisocyanate)

Polymerizable compound 2: ATM-4E (manufactured by Shin Nakamura Chemical Co., Ltd.; ethoxylated pentaerythritol tetraacrylate)

Graft copolymer 2: This is polymer particles of graft copolymer with poly(ethylene glycol) methyl ether methacrylate/styrene/acrylonitrile=10:9:81, more specifically, a dispersion containing 24 wt % of the polymer particles in a solvent having n-propanol and water in a weight ratio of 80/20. The volume average particle size thereof is 193 nm.

Infrared Absorber (1): Compound Below

[Chemical Formula 15]

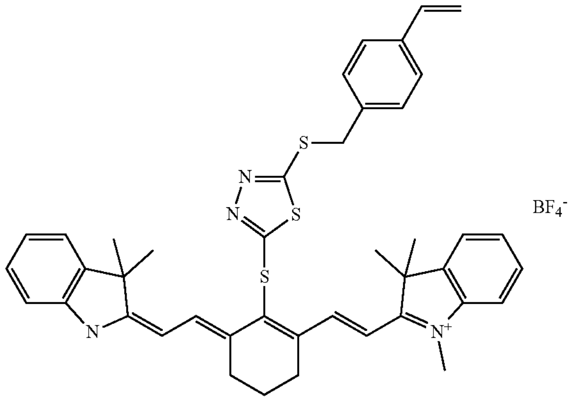

[Formation of Protective Layer]

Further, a protective layer-forming coating liquid (1) of the composition shown below was applied onto the image recording layer by bar coating and dried in an oven at 120° C. for 60 seconds to form a protective layer having a dry coating weight of 0.15 g/$m^2$, thereby obtaining a lithographic printing plate precursor.

<Protective Layer-Forming Coating Liquid (1)>

Dispersion of inorganic layered compound (1) 1.5 g 6 wt % Aqueous solution of polyvinyl alcohol (CKS50 manufactured by Nippon Synthetic Chemical Industry Co., Ltd.; modified with sulfonic acid; degree of saponification: at least 99 mol %; degree of polymerization: 300) 0.55 g 6 wt % Aqueous solution of polyvinyl alcohol (PVA-405 manufactured by Kuraray Co., Ltd.; degree of saponification: 81.5 mol %; degree of polymerization: 500) 0.03 g —Preparation of Dispersion of Inorganic Layered Compound (1)—

Synthetic mica Somasif ME-100 (manufactured by Co-Op Chemical Co., Ltd.) in an amount of 6.4 parts by weight was added to 193.6 parts by weight of ion-exchanged water and dispersed in the water with a homogenizer to an average particle size (as measured by a laser scattering method) of 3 μm. The dispersed particles had an aspect ratio of at least 100.

[Evaluation Method]

(1) Press Life

The resulting lithographic printing plate precursor was exposed by Luxel PLATESETTER T-6000III manufactured by FUJIFILM Corporation equipped with an infrared semiconductor laser at an external drum rotational speed of 1,000 rpm, a laser power of 70% and a resolution of 2,400 dpi. The exposed image was formed to contain a solid image and a 3% halftone chart of a 20 μm-dot FM (Frequency Modulation) screen.

The obtained lithographic printing plate precursor after exposure was mounted without development process on the plate cylinder of a Lithrone 26 printing press manufactured by Komori Corporation. A fountain solution Ecolity-2 (FUJIFILM Corporation)/tap water at a volume ratio of 2/98 and Values-G (N) black ink (Dainippon Ink and Chemicals, Inc.) were used. The fountain solution and the ink were supplied by the standard automatic printing start-up procedure on the Lithrone 26 to perform on-press development, and printing was made on Tokubishi art paper (76.5 kg) at a printing speed of 10,000 impressions per hour.

The image recording layer was gradually worn away with increasing number of impressions, thus reducing the ink density on the printed paper.

The solid press life was evaluated by the number of impressions at the time when the decrease in density of a solid image became visually recognizable.

The halftone dot area ratio of the 3% halftone dot of FM screen on printed paper was measured with a Gretag densitometer, and the number of impressions at which the measured value was reduced by 20% from the value measured in the 100th impression was regarded as the printing end number. The tiny dot press life was evaluated based on the printing end number. The results are shown in Table 2 below.

(2) Scumming Resistance

Printing was performed on the lithographic printing plate obtained in (1) above in the same manner as that described in (1) above, and staining on the blanket in non-image portions after 10,000 impressions had been printed was transferred to tape. The scumming resistance was rated as "100" when the ink stain area per 1 $cm^2$ was less than 1%, "90" when the ink stain area per 1 $cm^2$ was not less than 1% but less than 2%, "80" when the ink stain area per 1 $cm^2$ was not less than 2% but less than 4%, and "70" when the ink stain area per 1 $cm^2$ was not less than 4% but less than 6%. The results are shown in Table 2 below.

(3) Plate Inspection Properties (Image Visibility)

Using the L value (lightness) in the L*a*b* color system, the plate inspection properties were represented by a difference ΔL between the L value in an exposed portion and the L value in a non-exposed portion. A larger difference ΔL means more excellent plate inspection properties. The measurement was carried out by an SCE (Specular Component Excluded) method with CM-2600d spectrophotometer and CM-S100 W operation software manufactured by Konica Minolta, Inc. The results are shown in Table 2 below.

TABLE 2

| | Graining | | | | Anodized film | | | |
|---|---|---|---|---|---|---|---|---|
| | | | | | Large-diameter portion | | Small-diameter portion | |
| | Density of Specific pits (pits/mm²) | Surface area ratio Δ S (%) | Average diameter of smallwave concave portions (μm) | Lightness L * | Average surface layer diameter (nm) | Depth (nm) | Average inner diameter (nm) | Depth (nm) |
| EX 1 | 3090 | 41 | 0.2 | 80 | 8 | — | 8 | — |
| EX 2 | 3320 | 40 | 0.2 | 77 | 8 | — | 8 | — |
| EX 3 | 3790 | 41 | 0.2 | 75 | 8 | — | 8 | — |
| EX 4 | 5040 | 42 | 0.2 | 71 | 8 | — | 8 | — |
| EX 5 | 3790 | 35 | 0.2 | 82 | 8 | — | 8 | — |
| EX 6 | 3790 | 38 | 0.2 | 79 | 8 | — | 8 | — |
| EX 7 | 3790 | 48 | 0.2 | 73 | 8 | — | 8 | — |
| EX 8 | 3790 | 52 | 0.2 | 70 | 8 | — | 8 | — |
| EX 9 | 3790 | 41 | 0.01 | 75 | 8 | — | 8 | — |
| EX 10 | 3790 | 41 | 0.05 | 74 | 8 | — | 8 | — |
| EX 11 | 3790 | 41 | 0.11 | 76 | 8 | — | 8 | — |
| EX 12 | 3790 | 41 | 0.28 | 76 | 8 | — | 8 | — |
| EX 13 | 3790 | 41 | 0.49 | 75 | 8 | — | 8 | — |
| EX 14 | 3790 | 41 | 0.2 | 67 | 8 | — | 8 | — |
| EX 15 | 3790 | 41 | 0.2 | 84 | 8 | — | 8 | — |
| EX 16 | 3790 | 41 | 0.2 | 92 | 8 | — | 8 | — |
| EX 17 | 3790 | 41 | 0.2 | 75 | 13 | — | 13 | — |
| EX 18 | 3790 | 41 | 0.2 | 75 | 25 | — | 25 | — |
| EX 19 | 3790 | 41 | 0.2 | 75 | 33 | — | 33 | — |
| EX 20 | 3790 | 41 | 0.2 | 75 | 41 | — | 41 | — |
| EX 21 | 3790 | 41 | 0.2 | 75 | 28 | 100 | 8 | 900 |
| EX 22 | 3790 | 41 | 0.2 | 75 | 35 | 100 | 8 | 900 |
| EX 23 | 3790 | 41 | 0.2 | 75 | 8 | — | 8 | — |
| EX 24 | 3790 | 41 | 0.2 | 75 | 8 | — | 8 | — |
| EX 25 | 3790 | 41 | 0.2 | 75 | 25 | 700 | 8 | 300 |
| EX 26 | 3790 | 41 | 0.2 | 75 | 32 | — | 100 | — |
| EX 27 | 3790 | 41 | 0.2 | 75 | 32 | — | 100 | — |
| EX 28 | 3790 | 41 | 0.2 | 83 | 40 | 500 | 8 | 1000 |
| EX 29 | 3790 | 41 | 0.2 | 83 | 100 | 500 | 8 | 1000 |
| EX 30 | 3790 | 41 | 0.2 | 83 | 40 | 500 | 20 | 1000 |
| EX 31 | 3790 | 41 | 0.2 | 83 | 148 | 500 | 20 | 1000 |
| EX 32 | 3790 | 29 | 0.2 | 85 | 40 | 500 | 8 | 1000 |

TABLE 2-continued

| | | | | | | | | |
|---|---|---|---|---|---|---|---|---|
| CE 1 | 970 | 41 | 0.2 | 75 | 8 | — | 8 | — |
| CE 2 | 2890 | 41 | 0.2 | 75 | 8 | — | 8 | — |
| CE 3 | 1730 | 41 | 0.2 | 75 | 8 | — | 8 | — |
| CE 4 | 2280 | 45 | 0.2 | 75 | 8 | — | 8 | — |

| | | | Evaluation | | | |
|---|---|---|---|---|---|---|
| | Type of undercoat layer | Type of image recording layer | Solid press life (number of impressions) | Tiny dot press life (number of impressions) | Scumming resistance | Plate inspection properties ΔL |
| EX 1 | A | A | 80,000 | 80,000 | 80 | 3.5 |
| EX 2 | A | A | 80,000 | 80,000 | 80 | 3 |
| EX 3 | A | A | 90,000 | 90,000 | 80 | 3 |
| EX 4 | A | A | 90,000 | 100,000 | 70 | 3 |
| EX 5 | A | A | 80,000 | 80,000 | 80 | 3.5 |
| EX 6 | A | A | 90,000 | 80,000 | 80 | 3.5 |
| EX 7 | A | A | 90,000 | 90,000 | 80 | 3 |
| EX 8 | A | A | 90,000 | 100,000 | 80 | 3 |
| EX 9 | A | A | 80,000 | 80,000 | 80 | 3 |
| EX 10 | A | A | 80,000 | 80,000 | 80 | 3 |
| EX 11 | A | A | 90,000 | 90,000 | 80 | 3 |
| EX 12 | A | A | 90,000 | 90,000 | 80 | 3 |
| EX 13 | A | A | 80,000 | 80,000 | 80 | 3 |
| EX 14 | A | A | 90,000 | 90,000 | 80 | 3 |
| EX 15 | A | A | 90,000 | 90,000 | 80 | 3.5 |
| EX 16 | A | A | 90,000 | 90,000 | 80 | 4 |
| EX 17 | A | A | 100,000 | 90,000 | 80 | 3 |
| EX 18 | A | A | 100,000 | 100,000 | 80 | 3 |
| EX 19 | A | A | 110,000 | 100,000 | 80 | 3 |
| EX 20 | A | A | 110,000 | 100,000 | 70 | 3 |
| EX 21 | A | A | 100,000 | 100,000 | 80 | 3 |
| EX 22 | A | A | 110,000 | 100,000 | 80 | 3 |
| EX 23 | B | A | 90,000 | 90,000 | 100 | 3 |
| EX 24 | C | A | 90,000 | 90,000 | 100 | 3 |
| EX 25 | C | A | 100,000 | 100,000 | 100 | 3 |
| EX 26 | C | A | 90,000 | 90,000 | 90 | 3 |
| EX 27 | — | B | 90,000 | 90,000 | 90 | 3 |
| EX 28 | A | C | 100,000 | 100,000 | 90 | 3 |
| EX 29 | A | C | 110,000 | 110,000 | 90 | 4 |
| EX 30 | A | C | 100,000 | 100,000 | 90 | 3 |
| EX 31 | A | C | 110,000 | 110,000 | 90 | 4.5 |
| EX 32 | A | C | 90,000 | 90,000 | 100 | 4 |
| CE 1 | A | A | 80,000 | 60,000 | 80 | 3 |
| CE 2 | A | A | 80,000 | 60,000 | 80 | 3 |
| CE 3 | A | A | 60,000 | 60,000 | 80 | 3 |
| CE 4 | A | A | 90,000 | 70,000 | 90 | 3 |

EX: Example
CE: Comparative Example

As shown in Table 2 above, it was revealed that when the surface of the aluminum support on the image recording layer side had the specific pits at a density of less than 3,000 pits/$mm^2$, the tiny dot press life was short (Comparative Examples 1 to 4).

In contrast, it was revealed that when the surface of the aluminum support on the image recording layer side had the specific pits at a density of not less than 3,000 pits/$mm^2$, the resulting lithographic printing plate had a long tiny dot press life (Examples 1 to 32).

REFERENCE SIGNS LIST ta anodic reaction time
tc cathodic reaction time
tp a period of time required for current to reach a peak from zero
Ia peak current on the anode cycle side
Ic peak current on the cathode cycle side
10 lithographic printing plate precursor
12*a*, 12*b* aluminum support
14 undercoat layer
16 image recording layer
18 aluminum plate
20*a*, 20*b* anodized film
22*a*, 22*b* micropore
24 large-diameter portion
26 small-diameter portion
50 main electrolytic cell
51 AC power source
52 radial drum roller
53*a*, 53*b* main electrode
54 electrolytic solution feed inlet
55 electrolytic solution
56 auxiliary anode
60 auxiliary anode cell
W aluminum plate
610 anodizing apparatus
612 power supply cell
614 electrolytic cell
616 aluminum plate
618, 626 electrolytic solution
620 power supply electrode
622, 628 roller

624 nip roller
630 electrolytic electrode
632 cell wall
634 DC power source

The invention claimed is:

1. A lithographic printing plate precursor having an aluminum support and an image recording layer disposed above the aluminum support, wherein the aluminum support includes an aluminum plate and an anodized film of aluminum formed on the aluminum plate, wherein the image recording layer is positioned on the anodized film side of the aluminum support, wherein when measured over a 400 μm×400 μm region of a surface of the aluminum support on the image recording layer side using a three-dimensional non-contact roughness tester, pits with a depth from centerline of at least 0.70 μm are present at a density of at least 3,000 pits/$mm^2$, and wherein a surface area ratio ΔS is not less than 35%, the surface area ratio ΔS being determined by Formula (1):

$$\Delta S=(S_X-S_0)/S_0\times 100(\%) \quad (1)$$

using an actual area $S_x$ obtained, through three-point approximation, from three-dimensional data acquired by measurement at 512×512 points in 25 μm square of the surface of the aluminum support on the image recording layer side by means of an atomic force microscope and a geometrically measured area $S_o$.

2. The lithographic printing plate precursor according to claim 1, wherein the surface of the aluminum support on the image recording layer side has pits having an average aperture size of 0.01 to 0.5 μm.

3. The lithographic printing plate precursor according to claim 1, wherein the surface of the aluminum support on the image recording layer side has a lightness L* of 68 to 90 in a L*a*b* color system.

4. The lithographic printing plate precursor according to claim 1, wherein the anodized film has micropores extending from a surface of the anodized film opposite from the aluminum plate in a depth direction of the anodized film, and wherein an average diameter of the micropores at the surface of the anodized film is from 10 to 150 nm.

5. The lithographic printing plate precursor according to claim 4, wherein the average diameter of the micropores at the surface of the anodized film is from 10 to 100 nm.

6. The lithographic printing plate precursor according to claim 5, wherein each of the micropores has a large-diameter portion which extends from the surface of the anodized film to a depth of 10 to 1,000 nm and a small-diameter portion which communicates with a bottom of the large-diameter portion and extends to a depth of 20 to 2,000 nm from a communication position between the small-diameter portion and the large-diameter portion, wherein an average diameter of the large-diameter portion at the surface of the anodized film is 15 to 60 nm, and wherein an average diameter of the small-diameter portion at the communication position is not more than 13 nm.

7. The lithographic printing plate precursor according to claim 1, further including an undercoat layer between the aluminum support and the image recording layer, wherein the undercoat layer contains polyvinylphosphonic acid.

8. The lithographic printing plate precursor according to claim 1, further including an undercoat layer between the aluminum support and the image recording layer, wherein the undercoat layer contains a compound having a betain structure.

9. A lithographic printing plate manufacturing method, comprising:

an exposure step of imagewise exposing the lithographic printing plate precursor according to claim 1 to form exposed portions and unexposed portions; and a removal step of removing the unexposed portions of the lithographic printing plate precursor having been imagewise exposed.

10. A printing method, comprising:

an exposure step of imagewise exposing the lithographic printing plate precursor according to claim 1 to form exposed portions and unexposed portions; and a printing step of performing printing by supplying at least one of printing ink and fountain solution to remove the unexposed portions of the lithographic printing plate precursor having been imagewise exposed, on a printing press.

11. A method of manufacturing an aluminum support used in the lithographic printing plate precursor according to claim 1, the method comprising:

a hydrochloric acid electrolytic treatment step of subjecting an aluminum plate to alternating current electrolysis in a hydrochloric acid treatment solution having a sulfuric acid concentration of 0.1 to 2.0 g/L to thereby manufacture a surface-roughened aluminum plate.

12. The method of manufacturing an aluminum support according to claim 11, the method comprising:

an anodizing treatment step of anodizing the surface-roughened aluminum plate to form an anodized film of aluminum on the aluminum plate; and a pore-widening treatment step of enlarging a diameter of micropores present in the anodized film by subjecting the aluminum plate having the anodized film formed thereon to etching treatment, the anodizing treatment step and the pore-widening treatment step being carried out in this order after the hydrochloric acid electrolytic treatment step.

13. The method of manufacturing an aluminum support according to claim 12, wherein the anodizing treatment step is a step of carrying out anodizing treatment using phosphoric acid.

14. A lithographic printing plate precursor having an aluminum support and an image recording layer disposed above the aluminum support, wherein the aluminum support includes an aluminum plate and an anodized film of aluminum formed on the aluminum plate, wherein the image recording layer is positioned on the anodized film side of the aluminum support, and wherein when measured over a 400 μm×400 μm region of a surface of the aluminum support on the image recording layer side using a three-dimensional non-contact roughness tester, pits with a depth from centerline of at least 0.70 μm are present at a density of at least 3,000 pits/$mm^2$, wherein each of the micropores has a large-diameter portion which extends from the surface of the anodized film to a depth of 10 to 1,000 nm and a small-diameter portion which communicates with a bottom of the large-diameter portion and extends to a depth of 20 to 2,000 nm from a communication position between the small-diameter portion and the large-diameter portion, wherein an average diameter of the large-diameter portion at the surface of the anodized film is 15 to 60 nm, and wherein an average diameter of the small-diameter portion at the communication position is not more than 13 nm.

15. The lithographic printing plate precursor according to claim 14, wherein the surface of the aluminum support on the image recording layer side has a lightness L* of 68 to 90 in a L*a*b* color system.

16. The lithographic printing plate precursor according to claim 14, wherein the anodized film has micropores extending from a surface of the anodized film opposite from the aluminum plate in a depth direction of the anodized film, and wherein an average diameter of the micropores at the surface of the anodized film is from 10 to 150 nm.

17. The lithographic printing plate precursor according to claim 14, wherein the surface of the aluminum support on the image recording layer side has a lightness L* of 75 to 90 in a L*a*b* color system.

18. The lithographic printing plate precursor according to claim 14, wherein the image recording layer contains a polymeric compound in a form of fine particles, and the polymeric compound in the form of fine particles contains a copolymer including styrene and acrylonitrile.

19. The lithographic printing plate precursor according to claim 14, wherein the image recording layer contains a borate compound.

20. The lithographic printing plate precursor according to claim 14, wherein the image recording layer contains an acid color former.

* * * * *